US007873174B2

(12) United States Patent
Yoshino et al.

(10) Patent No.: US 7,873,174 B2
(45) Date of Patent: Jan. 18, 2011

(54) METHOD OF CONTROLLING OUTPUT OF ULTRASONIC SPEAKER, ULTRASONIC SPEAKER SYSTEM, AND DISPLAY DEVICE

(75) Inventors: Hiroyuki Yoshino, Suwa (JP); Shinichi Miyazaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1022 days.

(21) Appl. No.: 11/670,349

(22) Filed: Feb. 1, 2007

(65) Prior Publication Data

US 2007/0183605 A1 Aug. 9, 2007

(30) Foreign Application Priority Data

Feb. 3, 2006 (JP) ............................. 2006-026592
Dec. 26, 2006 (JP) ............................. 2006-350050

(51) Int. Cl.
*H03G 9/00* (2006.01)

(52) U.S. Cl. .......................... 381/77; 704/200; 704/201

(58) Field of Classification Search ........... 381/98–104, 381/106–110, 118, 191, 152, 75, 77, 82, 381/116, 354, 6, 14–16, 55, 59, 96; 704/200, 704/201; 367/118
See application file for complete search history.

(56) References Cited

U.S. PATENT DOCUMENTS

2005/0281420 A1* 12/2005 Sekino et al. ............... 381/191
2006/0033882 A1* 2/2006 Matsuzawa et al. ........... 353/15
2006/0072770 A1* 4/2006 Miyazaki .................... 381/116

FOREIGN PATENT DOCUMENTS

JP 06-216681 * 5/1994
JP 06-216681 8/1994

* cited by examiner

*Primary Examiner*—Vivian Chin
*Assistant Examiner*—Leshui Zhang
(74) *Attorney, Agent, or Firm*—Workman Nydegger

(57) ABSTRACT

A method of controlling an output of an ultrasonic speaker that reproduces audible-frequency-band signal sounds by modulating carrier waves with audible-frequency-band signal waves output from a signal source and driving an ultrasonic transducer with the modulated waves includes: dividing the audible-frequency-band signal waves into a plurality of frequency bands; separately adjusting amplitudes of the signal waves and amplitudes of the modulated waves in the respective frequency bands; and driving a plurality of ultrasonic transducers provided corresponding to the respective frequency bands with the modulated waves generated corresponding to the respective frequency bands. Band-corresponding volume setting data, which is used to set volume of the ultrasonic transducers corresponding to the respective frequency bands by means of a plurality of band-corresponding volume setting units provided corresponding to the respective frequency bands, and overall volume setting data, which is used to set volume in common with respect to the plurality of ultrasonic transducers by means of an overall volume setting unit, are provided. Gains of modulated wave amplitude adjustment units that adjust the amplitudes of the modulated waves in the respective frequency bands are determined corresponding to the respective frequency bands on the basis of a combination of the band-corresponding volume setting data and the overall volume setting data.

15 Claims, 14 Drawing Sheets

| SIGNAL WAVE MAXIMUM AMPLITUDE VALUE [V] | OUTPUT (SIGNAL WAVE AMPLITUDE GAIN CONTROL SIGNAL) |
|---|---|
| EQUAL TO OR LARGER THAN 0 AND LESS THAN 0.1 | 00001 |
| EQUAL TO OR LARGER THAN 0.1 AND LESS THAN 0.2 | 00010 |
| • | • |
| • | • |
| • | • |
| EQUAL TO OR LARGER THAN 0.8 AND LESS THAN 0.9 | 01001 |
| EQUAL TO OR LARGER THAN 0.9 AND LESS THAN 1.0 | 01010 |
| • | • |
| • | • |
| • | • |

FIG. 6A

| SET VALUE OF FIRST BAND-CORRESPONDING VOLUME SETTING KNOB | OUTPUT (FIRST BAND-CORRESPONDING VOLUME IDENTIFICATION SIGNAL) |
|---|---|
| 1 | 0001 |
| 2 | 0010 |
| 3 | 0011 |
| 4 | 0100 |
| · | · |
| · | · |
| 15 | 1111 |

FIG. 6B

| SET VALUE OF SECOND BAND-CORRESPONDING VOLUME SETTING KNOB | OUTPUT (SECOND BAND-CORRESPONDING VOLUME IDENTIFICATION SIGNAL) |
|---|---|
| 1 | 0001 |
| 2 | 0010 |
| 3 | 0011 |
| 4 | 0100 |
| · | · |
| · | · |
| 15 | 1111 |

FIG. 6C

| SET VALUE OF VOLUME SETTING KNOB | OUTPUT (VOLUME IDENTIFIER SIGNAL) |
|---|---|
| 1 | 0001 |
| 2 | 0010 |
| 3 | 0011 |
| 4 | 0100 |
| · | · |
| · | · |
| 15 | 1111 |

| FIRST BAND-CORRESPONDING VOLUME IDENTIFICATION SIGNAL | VOLUME IDENTIFI-CATION SIGNAL | AMPLITUDE GAIN OF FIRST MODULATED WAVE THAT IS CONTROLLED |
|---|---|---|
| 00001 | 0001 | A1 |
| | 0010 | A2 |
| | 0011 | A3 |
| | 0100 | A4 |
| | · | · |
| | · | · |
| | · | · |
| | · | · |
| | · | · |
| | · | · |
| | 1111 | A15 |
| 00010 | 0001 | A16 |
| | 0010 | A17 |
| | 0011 | A18 |
| | 0100 | A19 |
| | · | · |
| | · | · |
| | · | · |
| | · | · |
| | · | · |
| | · | · |
| | 1111 | A30 |
| 00011 | 0001 | A31 |
| · | · | · |
| · | · | · |

FIG. 7A

| SECOND BAND-CORRESPONDING VOLUME IDENTIFICATION SIGNAL | VOLUME IDENTIFI-CATION SIGNAL | AMPLITUDE GAIN OF SECOND MODULATED WAVE THAT IS CONTROLLED |
|---|---|---|
| 00001 | 0001 | B1 |
| | 0010 | B2 |
| | 0011 | B3 |
| | 0100 | B4 |
| | · | · |
| | · | · |
| | · | · |
| | · | · |
| | · | · |
| | · | · |
| | 1111 | B15 |
| 00010 | 0001 | B16 |
| | 0010 | B17 |
| | 0011 | B18 |
| | 0100 | B19 |
| | · | · |
| | · | · |
| | · | · |
| | · | · |
| | · | · |
| | · | · |
| | 1111 | B30 |
| 00011 | 0001 | B31 |
| · | · | · |
| · | · | · |

FIG. 7B

METHOD OF CONTROLLING OUTPUT OF ULTRASONIC SPEAKER, ULTRASONIC SPEAKER SYSTEM, AND DISPLAY DEVICE

BACKGROUND

1. Technical Field

The present invention relates to a method of controlling an output of an ultrasonic speaker that drives ultrasonic transducers with modulated signals obtained by modulating ultrasonic-frequency-band carrier waves with audible-frequency-band sound waves (for example, audio signals), an ultrasonic speaker system, and a display device.

2. Related Art

An ultrasonic speaker is used, for example, to transmit sound information to a specific place because the ultrasonic speaker is highly directional as compared with a typical speaker. For example, an ultrasonic speaker is provided such that when persons approach a work of art in an exhibition hall, such as an art gallery, only limited persons around the work of art may hear explanation on the work of art.

However, it is known that a sound pressure level of a self-demodulated sound within an audible band in an ultrasonic speaker becomes lower as closer to a low band. In addition, the sound pressure level of a self-demodulated sound in an ultrasonic speaker is proportional to an amplitude value (that is, degree of modulation in the case of a modulated wave) of a signal wave. Accordingly, in order to realize the satisfactory sound quality in the ultrasonic speaker, it is necessary to set a degree of modulation in the middle and low frequency band as high as possible so as not to be overmodulated and to set a degree of modulation in the middle and high frequency band to be lower than that in the middle and low frequency band.

A device for adjusting base and treble of a specified audio signal is proposed (refer to JP-A-6-216681). As can be seen from the device, in the case of changing volume in each band by means of a base that changes a frequency characteristic of an audio signal in the middle and low frequency band and a treble that changes a frequency characteristic of the audio signal in the middle and high frequency band, a typical audio device generally has a base adjustment knob and a treble adjustment knob in an amplifier. In the case of a typical audio device, only by adjusting the volume in each band by the use of base and treble, it is possible to sufficiently make an adjustment to proper sound quality and volume with respect to various music sources.

However, when a technique of adjusting the volume in each band by means of the base and the treble is applied to an ultrasonic speaker in the same manner as in the above-described typical audio device, a base adjustment knob and a treble adjustment knob are provided to a modulator so as to change the amplitude of an audio signal in each band. This is the same as changing the degree of modulation in each band, and the same operation as described above can be actually performed in the above device. However, in reality, when listening to audio sources, such as music, through an ultrasonic speaker, the sound pressure level in the middle and low frequency band can be adjusted within only a low range even if the degree of modulation is adjusted corresponding to each frequency band as described above. As a result, the satisfactory quality of sound is not obtained.

Here, an audio signal refers to a signal obtained by mixing signals having various frequency components. When comparing dynamic ranges of signal wave amplitude of, for example, a single sine wave having a frequency of 0.5 kHz and amplitude of 1 V and a mixed wave obtained by mixing a sine wave having a frequency of 0.5 kHz and amplitude of 1 V and a signal wave having a frequency of 2 kHz and amplitude of 1 V, the maximum amplitude of the former single sine wave is 1 V and the maximum amplitude of the latter mixed wave is 2 V.

Here, a case is assumed in which the amplitude of the single sine wave and the amplitude of the mixed wave can be changed, carrier waves (having constant amplitude) are modulated in each of the single sine wave and the mixed wave, and the degree of modulation of each modulated wave is set to be 100%. In this case, assuming that the degree of modulation of a modulated wave in the case of the single sine wave is 100% in a state in which the amplitude of the single sine wave (components corresponding to 0.5 kHz) is 1 V, the degree of modulation of a modulated wave in the case of the mixed wave is 100% in a state in which the amplitude of the mixed wave, that is, the amplitude of components (corresponding to 0.5 kHz) included in the mixed wave is 0.5 V. Accordingly, when the two types of modulated waves are emitted from different ultrasonic transducers (whose performance is the same), the sound pressure level of a self-demodulated sound corresponding to 0.5 kHz is larger in the single sine wave than in the mixed wave.

The above state may also be changed by the phase of each signal wave that is mixed, but the state is considered to be true for most of the cases. Accordingly, in order to set the degree of modulation in the middle and low frequency band to be large in the ultrasonic speaker (in order to increase a sound pressure level in the middle and low frequency band), it is important to divide audio signals into a plurality of frequency bands and to reduce frequency components, which are included in signals within the middle and low frequency band, to the minimum.

In order to realize those described above, it is necessary to make frequency components included in each of the bands smaller than frequency components included in original audio signals by causing the audio signals to pass through a plurality of band pass filters, to modulate carrier waves with signal waves in respective frequency bands, and to drive ultrasonic transducers provided corresponding to the respective frequency bands with modulated waves in the respective frequency bands.

As described above, in order to set the degree of modulation in the middle and low frequency band to be large in the ultrasonic speaker (in order to increase the sound pressure level in the middle and low frequency band), it is important to divide audio signals into a plurality of frequency bands, to make frequency components included in each of the bands smaller than frequency components included in original audio signals, to modulate carrier waves with signal waves in the respective frequency bands, and to drive ultrasonic transducers provided corresponding to the respective frequency bands.

Further, in the case when sound waves are emitted from ultrasonic transducers provided corresponding to respective frequency bands, it is an issue that a large amount of power is consumed as compared with a case in which a single ultrasonic transducer is driven.

Furthermore, it is necessary to adjust the degree of modulation and amplitude of a modulated wave in correspondence with each frequency band. Due to many parameters, this causes a problem in which an adjustment to proper sound quality and volume with respect to various audio signals is not easily made, unlike the device disclosed in JP-A-6-216681.

SUMMARY

An advantage of some aspects of the invention is that it provides a method of controlling an output of an ultrasonic speaker, an ultrasonic speaker system, and a display device using the ultrasonic speaker in which an adjustment can be made such that volume in the middle and low frequency band is output to a large degree, an adjustment to proper sound quality and volume with respect to audio signals can be easily made, it is possible to prevent modulated waves from being overmodulated, and it is possible to prevent an overvoltage from being applied to an ultrasonic transducer and which can be driven with low power consumption.

In the invention, it is possible to set modulated waves in respective frequency bands with a large degree of modulation by making frequency components included in signals within the respective bands smaller than frequency components included in original audio signals by causing the audio signals to pass through a plurality of band pass filters, modulating carrier waves with signal waves in correspondence with the respective frequency bands, and driving different ultrasonic transducers, which are provided corresponding to the respective frequency bands, with modulated waves in the respective frequency bands. In this method, an adjustment can be made such that a sound pressure level particularly in a middle and low frequency band is output to the maximum.

Further, in the invention, band-corresponding volume setting units that respectively set the volume of sounds radiating from ultrasonic transducers, which are provided corresponding to respective frequency bands, are provided corresponding to respective frequency bands and an overall volume setting unit that in common sets the volume of sounds radiating from the ultrasonic transducers provided corresponding to respective frequency bands is also provided. Thus, by adjusting amplitude gain of modulated waves, which drive respective ultrasonic speakers, on the basis of tables prepared beforehand corresponding to the respective frequency bands according to set values of the band-corresponding volume setting units and the overall volume setting unit in the respective frequency bands, it is possible to easily change sound quality and volume of an ultrasonic speaker system similar to a typical audio device. In addition, in this method, it is possible to prevent an overvoltage from being applied to an ultrasonic transducer.

In this case, the following two methods may be considered as a method of adjusting the volume of the ultrasonic transducer. One method is to change the amplitude (that is, degree of modulation in the case of a modulated wave) of a signal wave, and the other method is to change the amplitude of a modulated wave (amplitudes of carrier waves are assumed to be constant). In the case of an ultrasonic speaker, even if the amplitudes of modulated waves are equal, the sound pressure of a self-demodulated sound of a modulated wave having a higher degree of modulation is larger.

Therefore, in the invention, high sound pressure can be output with low power consumption by setting degrees of modulation of modulated waves in the respective frequency bands to be large and setting amplitudes of the modulated waves in the respective frequency bands as small as possible. Furthermore, at this time, by detecting maximum amplitude values of signal waves in the respective frequency bands and by adjusting the maximum values of amplitudes of the signal waves in the respective frequency bands to be as high as possible and be constant within a range in which the degree of modulation of modulated waves in the respective frequency bands is not overmodulated on the basis of the detected information, it is possible to drive the ultrasonic speaker with low power consumption even when audio sources change and to prevent modulated waves from being overmodulated in the respective frequency bands.

In order to achieve the above objects, according to an aspect of the invention, a method of controlling an output of an ultrasonic speaker that reproduces audible-frequency-band signal sounds by modulating carrier waves with audible-frequency-band signal waves output from a signal source and driving an ultrasonic transducer with the modulated waves includes: dividing the audible-frequency-band signal waves into a plurality of frequency bands; separately adjusting amplitudes of the signal waves and amplitudes of the modulated waves in the respective frequency bands; and driving a plurality of ultrasonic transducers provided corresponding to the respective frequency bands with the modulated waves generated corresponding to the respective frequency bands. In addition, band-corresponding volume setting data, which is used to set volume of the ultrasonic transducers corresponding to the respective frequency bands by means of a plurality of band-corresponding volume setting units provided corresponding to the respective frequency bands, and overall volume setting data, which is used to set volume in common with respect to the plurality of ultrasonic transducers by means of an overall volume setting unit, are provided. In addition, gains of modulated wave amplitude adjustment units that adjust the amplitudes of the modulated waves in the respective frequency bands are determined corresponding to the respective frequency bands on the basis of a combination of the band-corresponding volume setting data and the overall volume setting data.

In the method of controlling an output of an ultrasonic speaker described above, it is preferable to further include detecting amplitude data of the signal waves in the respective divided frequency bands and making a control on the basis of the detected amplitude data of the signal waves in the respective frequency bands such that maximum amplitude values of the signal waves in the respective frequency bands are constant by means of signal wave amplitude adjustment units provided corresponding to the respective frequency bands.

Further, in the method of controlling an output of an ultrasonic speaker described above, preferably, maximum amplitude values of the signal waves in the respective divided frequency bands are amplified to a large degree in signal wave amplitude adjustment units provided corresponding to the respective frequency bands within a range in which the modulated waves in the respective frequency bands are not overmodulated.

Furthermore, in the method of controlling an output of an ultrasonic speaker described above, preferably, a control is made such that the gains of the modulated wave amplitude adjustment units increase in proportion to increase of set values of the band-corresponding volume setting units.

Furthermore, in the method of controlling an output of an ultrasonic speaker described above, preferably, a control is made such that the gains of the modulated wave amplitude adjustment units under a condition of set values of the band-corresponding volume setting units increase in proportion to increase of set values of the overall volume setting unit.

In addition, in the method of controlling an output of an ultrasonic speaker described above, preferably, set values of the overall volume setting unit are controlled such that a gain of the modulated wave amplitude adjustment unit corresponding to a lower frequency band of the plurality of divided frequency bands is larger in the case when set values of the band-corresponding volume setting units are equal to each other.

Further, according to another aspect of the invention, an ultrasonic speaker system having a signal source that generates signal waves in an audible frequency band, a carrier wave supply unit that generates carrier waves in an ultrasonic frequency band, and an ultrasonic transducer that modulates the carrier waves with the audible-frequency-band signal waves output from the signal source and is driven by the modulated waves includes: a plurality of filters that divide the audible-frequency-band signal waves into a plurality of frequency bands; a plurality of signal wave amplitude adjustment units that separately adjust amplitudes of the signal waves in the respective frequency bands; a plurality of modulation units that modulate the carrier waves with the signal waves in the respective frequency bands; a plurality of modulated wave amplitude adjustment units that separately adjust amplitudes of the modulated waves output from the plurality of modulation units; a plurality of ultrasonic transducers driven by output signals of the plurality of modulated wave amplitude adjustment units; band-corresponding volume setting units that are provided corresponding to the respective frequency bands and separately set volume of the ultrasonic transducers corresponding to the respective frequency bands; an overall volume setting unit that sets volume in common with respect to all of the ultrasonic transducers corresponding to the respective frequency bands; and modulated wave amplitude gain control units provided corresponding to the respective frequency bands that, in the respective frequency bands, receive band-corresponding volume setting data indicating states of the band-corresponding volume setting units and overall volume setting data indicating a state of the overall volume setting unit and determine gains of the modulated wave amplitude adjustment units provided corresponding to the respective frequency bands on the basis of a combination of the band-corresponding volume setting data and the overall volume setting data when adjusting amplitudes of the modulated waves generated in the respective frequency bands.

In the ultrasonic speaker system described above, it is preferable to further include a plurality of storage units that store a first table indicating the relationship between maximum amplitude data of the signal waves in the respective frequency bands and amplitude gains of the signal wave amplitude adjustment units provided corresponding to the respective frequency bands. In addition, when adjusting amplitudes of the signal waves in the respective frequency bands, the amplitude gains of the signal wave amplitude adjustment units provided corresponding to the respective frequency bands are determined referring to the first table on the basis of the maximum amplitude data provided corresponding to the respective frequency bands.

Furthermore, in the ultrasonic speaker system described above, preferably, the first table is configured to determine the amplitude gains of the signal wave amplitude adjustment units provided corresponding to the respective frequency bands such that maximum degrees of modulation of the modulated waves in the respective frequency bands are constant when the maximum amplitude data of the signal waves in the respective frequency bands changes.

Furthermore, in the ultrasonic speaker system described above, preferably, the first table is configured such that maximum amplitude values of the signal waves in the respective divided frequency bands are amplified to a large degree in the signal wave amplitude adjustment units provided corresponding to the respective frequency bands within a range in which the modulated waves in the respective frequency bands are not overmodulated.

Furthermore, in the ultrasonic speaker system described above, it is preferable to further include a plurality of storage units that store a second table indicating the relationship between amplitude gains of the modulated wave amplitude adjustment units provided corresponding to the respective frequency bands and the combination of the band-corresponding volume setting data provided corresponding to the respective frequency bands and volume setting data set in common corresponding to the frequency bands. In addition, when adjusting amplitudes of the modulated waves in the respective frequency bands, the amplitude gains of the modulated wave amplitude adjustment units provided corresponding to the respective frequency bands are determined referring to the second table on the basis of the band-corresponding volume setting data provided corresponding to the respective frequency bands and the volume setting data.

Furthermore, in the ultrasonic speaker system described above, preferably, the second table is configured such that the amplitude gains of the modulated wave amplitude adjustment units increase in proportion to increase of set values of the band-corresponding volume setting units.

Furthermore, in the ultrasonic speaker system described above, preferably, the second table is configured such that the amplitude gains of the modulated wave amplitude adjustment units under a condition of set values of the band-corresponding volume setting units increase in proportion to increase of set values of the overall volume setting unit.

In addition, in the ultrasonic speaker system described above, preferably, the second table is configured such that, as for set values of the overall volume setting unit, an amplitude gain of the modulated wave amplitude adjustment unit corresponding to a lower frequency band of the plurality of divided frequency bands is larger in the case when set values of the band-corresponding volume setting units are equal to each other.

Further, according to still another aspect of the invention, a display device includes: an ultrasonic speaker that reproduces audible-frequency-band signal sounds by modulating ultrasonic-frequency-band carrier wave signals with audible-frequency-band signal waves supplied from a sound source and driving an electrostatic ultrasonic transducer with the modulated signals; and a projection optical system that projects an image onto a projected surface. The ultrasonic speaker includes: a plurality of filters that divide the audible-frequency-band signal waves into a plurality of frequency bands; a plurality of signal wave amplitude adjustment units that separately adjust amplitudes of the signal waves in the respective frequency bands; a plurality of modulation units that modulate the ultrasonic-frequency-band carrier waves with signal waves in respective frequency bands output from the signal wave amplitude adjustment units; a plurality of modulated wave amplitude adjustment units that separately adjust amplitudes of modulated waves output from the plurality of modulation units; and a plurality of ultrasonic transducers driven by output signals of the plurality of modulated wave amplitude adjustment units.

Thus, in the ultrasonic speaker used in the display device according to the aspect of the invention, audible-frequency-band signal waves (audio signals) supplied from a sound source are divided into a plurality of frequency bands by means of the plurality of band pass filters and frequency components included in signals of the respective frequency bands are smaller than frequency components included in original audio signals. In addition, the amplitudes of signal waves in the respective frequency bands are respectively adjusted by the signal wave amplitude adjustment units, carrier waves are modulated with the signal waves in the respective frequency bands by means of the modulation units, an amplitude adjustment of modulated waves in the respective frequency bands is made by the modulated wave amplitude adjustment units, and the ultrasonic transducers provided corresponding to the respective frequency bands are driven by the modulated waves output from the modulated wave amplitude adjustment units. Accordingly, in the ultrasonic speaker used in the display device, it is possible to adjust modulated waves in the respective frequency bands with a high degree of modulation and to output sounds in the middle and low frequency band to the maximum. As a result, it is possible to easily make an adjustment to proper sound quality and volume with respect to audio signals.

In addition, according to still another aspect of the invention, a display device includes: an ultrasonic speaker that reproduces audible-frequency-band signal sounds by modulating ultrasonic-frequency-band carrier wave signals with audible-frequency-band signal waves supplied from a sound source and driving an electrostatic ultrasonic transducer with the modulated signals; and a projection optical system that projects an image onto a projected surface. The ultrasonic speaker includes: a plurality of filters that divide the audible-frequency-band signal waves into a plurality of frequency bands; a plurality of signal wave amplitude adjustment units that separately adjust amplitudes of the signal waves in the respective frequency bands; a plurality of modulation units that modulate the ultrasonic-frequency-band carrier waves with signal waves in respective frequency bands output from the signal wave amplitude adjustment units; a plurality of modulated wave amplitude adjustment units that separately adjust amplitudes of modulated waves output from the plurality of modulation units; a plurality of ultrasonic transducers driven by output signals of the plurality of modulated wave amplitude adjustment units; band-corresponding volume setting units that are provided corresponding to the respective frequency bands and serve to set volume of the ultrasonic transducers corresponding to the respective frequency bands; an overall volume setting unit that sets volume in common with respect to all of the ultrasonic transducers corresponding to the respective frequency bands; and modulated wave amplitude gain control units that, in the respective frequency bands, receive band-corresponding volume setting data indicating states of the band-corresponding volume setting units and overall volume setting data indicating a state of the overall volume setting unit and determine gains of the modulated wave amplitude adjustment units provided corresponding to the respective frequency bands on the basis of a combination of the band-corresponding volume setting data and the overall volume setting data when adjusting amplitudes of the modulated waves generated in the respective frequency bands.

Thus, in the ultrasonic speaker used in the display device according to the aspect of the invention, the band-corresponding volume setting units that respectively set the volume of sounds radiating from ultrasonic transducers, which are provided corresponding to respective frequency bands, are provided corresponding to the respective frequency bands and the overall volume setting unit that in common sets the volume of sounds radiating from the ultrasonic transducers provided corresponding to respective frequency bands is also provided. In addition, according to the combination of set data of the band-corresponding volume setting units and set data of the overall volume setting unit, the gains of the modulated wave amplitude adjustment units provided corresponding to the respective frequency bands are determined and the amplitude gains of the modulated waves that drive respective ultrasonic speakers are adjusted. As a result, it is possible to easily change the sound quality and volume of the ultrasonic speaker system in the same manner as a typical audio device.

BRIEF DESCRIPTION OF THE DRAWINGS

The invention will be described with reference to the accompanying drawings, wherein like numbers reference like elements.

FIG. 6A is a view illustrating the relationship between a set value of a band-corresponding volume setting knob and a band-corresponding volume identification signal output from a band-corresponding volume setting unit.

FIG. 6B is a view illustrating the relationship between a set value of a band-corresponding volume setting knob and a band-corresponding volume identification signal output from a band-corresponding volume setting unit.

FIG. 6C is a view illustrating the relationship between a set value of a volume setting knob and a volume identification signal output from a volume setting unit.

FIG. 7A is a view illustrating the relationship between a combination of a band-corresponding volume identification signal and a volume identification signal and a modulated wave amplitude gain of a modulated wave amplitude adjustment unit.

FIG. 7B is a view illustrating the relationship between a combination of a band-corresponding volume identification signal and a volume identification signal and a modulated wave amplitude gain of a modulated wave amplitude adjustment unit.

DESCRIPTION OF EXEMPLARY EMBODIMENTS

Hereinafter, embodiments of the invention will be described with reference to the accompanying drawings.

First Embodiment

Figure 1:
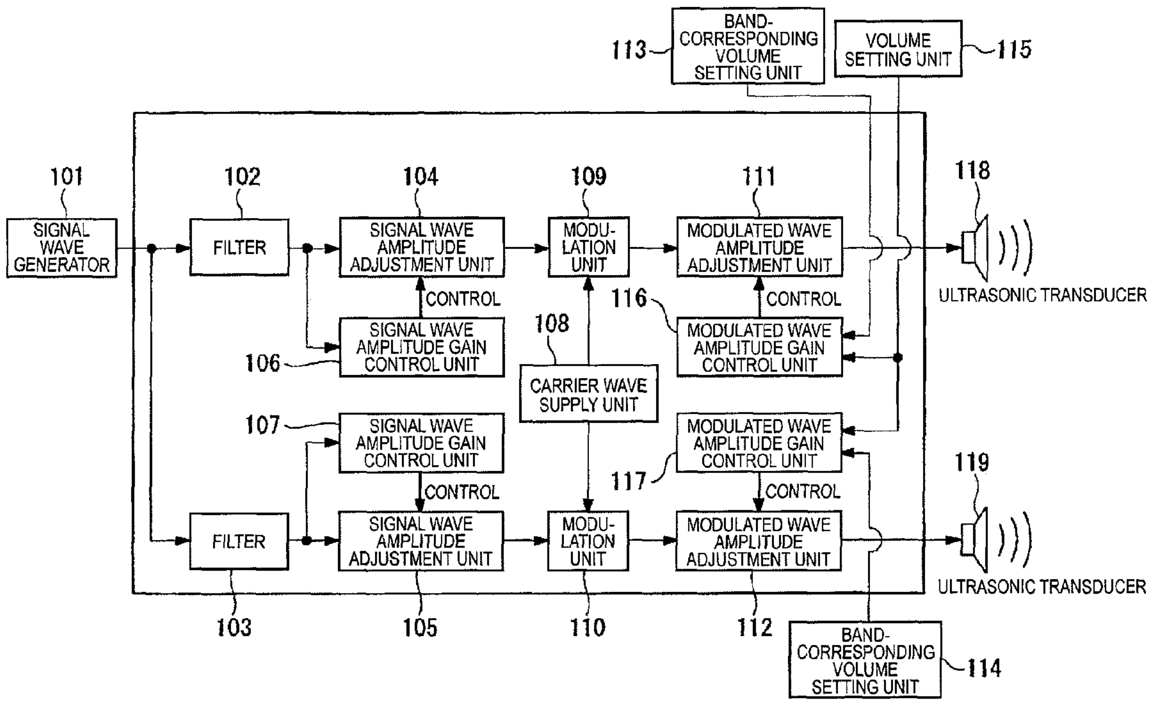
FIG. 1 is a block diagram illustrating the configuration of an ultrasonic speaker system according to an embodiment of the invention.
Figure 2:
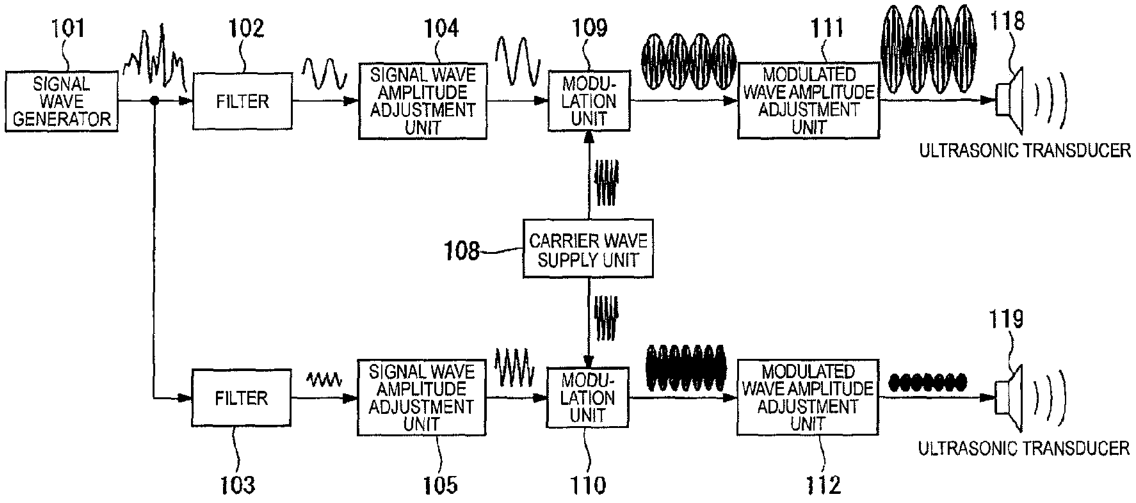
FIG. 2 is a view schematically illustrating signal waveforms in respective parts in the ultrasonic speaker system shown in FIG. 1.

The configuration of an ultrasonic speaker system according to an embodiment of the invention is shown in FIG. 1. In addition, FIG. 2 is a view schematically illustrating waveforms of signals having passed through respective constituent blocks in the configuration of the ultrasonic speaker system shown in FIG. 1. Here, even though some of constituent components shown in FIG. 1 are not intentionally shown in FIG. 2 for the sake of convenience, all of the constituent components shown in FIG. 1 are needed when actually using the invention. The ultrasonic speaker system according to the embodiment of the invention is an example of a system in which an adjustment can be made such that volume in the middle and low frequency band is output to the maximum, an adjustment to proper sound quality and volume with respect to audio signals can be easily made, it is possible to prevent modulated waves from being overmodulated, and it is possible to prevent an overvoltage from being applied to an ultrasonic transducer and which can be driven with low power consumption.

Referring to FIG. 1, the ultrasonic speaker system according to the present embodiment of the invention includes: a signal wave generator 101 that generates an audio signal (signal wave) as a signal source; a plurality of filters 102 and 103 that divide audio signals, which are signal waves within an audible frequency band, into a plurality of frequency bands; a plurality of signal wave amplitude adjustment units 104 and 105 that adjust amplitudes of signal waves in the respective bands; a plurality of signal wave amplitude gain control units 106 and 107 that control amplitude gains of the signal wave amplitude adjustment units in the respective bands on the basis of amplitude values of signal waves in the respective bands; a carrier wave supply unit 108 that generates and outputs carrier waves in an ultrasonic band; a plurality of modulation units 109 and 110 that modulate the carrier waves with signal wave in each of the band; a plurality of modulated wave amplitude adjustment units 111 and 112 that adjust amplitude of the modulated waves in each of the bands, which are output from the plurality of modulation units 109 and 110; a plurality of band-corresponding volume setting units 113 and 114 provided corresponding to the respective bands; an overall volume setting unit 115 provided in common for the bands; a modulated wave amplitude gain control unit 116 that controls an amplitude gain of the modulated wave amplitude adjustment unit 111 for each band on the basis of states of the band-corresponding volume setting unit 113 and the overall volume setting unit 115 in each band; a modulated wave amplitude gain control unit 117 that controls an amplitude gain of the modulated wave amplitude adjustment unit 112 for each band on the basis of states of the band-corresponding volume setting unit 114 and the overall volume setting unit 115 in each band; and a plurality of ultrasonic transducers 118 and 119 driven by modulated waves in the respective bands. In addition, the overall volume setting unit 115 is simply called a 'volume setting unit 115' (the same is true in the drawings).

The filter 102 is a low pass filter that causes components, which belong to a low frequency band, of audio signals (signal waves) output from the signal wave generator 101 to pass therethrough. Here, a cutoff frequency is assumed to be 4 kHz, for example. In addition, the filter 103 is a high pass filter that causes components, which belong to a high frequency band, of the audio signals to pass therethrough. Here, a cutoff frequency is assumed to be 4 kHz, for example. In the present embodiment, there is shown a case in which audio signals are divided into two frequency bands. Alternatively, it is possible to adopt a circuit system in which audio signals are divided into a plurality of (three or more) frequency bands, modulated waves are generated in respective frequency bands, and ultrasonic transducers provided corresponding to the respective frequency bands are driven.

The signal wave amplitude gain control units 106 and 107 have functions of receiving amplitude data of signal waves having passed through the filters 102 and 103 and of controlling amplitude gains with respect to the signal wave amplitude adjustment units 104 and 105 such that maximum values of amplitudes of the signal waves are constant when maximum values of amplitudes of the signal waves change. The signal wave amplitude adjustment units 104 and 105 have functions of adjusting amplitudes of signal waves output from the filters 102 and 103 on the basis of the amplitude gains set by the signal wave amplitude gain control units 106 and 107.

The carrier wave supply unit 108 generates and outputs carrier waves in an ultrasonic frequency band. The modulation units 109 and 110 have functions of modulating the carrier waves, which are output from the carrier wave supply unit 108, with the signal waves output from the signal wave amplitude adjustment units 104 and 105. Here, even though various modulation methods including amplitude modulation and frequency modulation may be considered as modulation methods of a modulation unit, the amplitude modulation is mainly used in the ultrasonic speaker system. Accordingly, in the present embodiment, the amplitude modulation is used as an example of a modulation method performed by the modulation units 109 and 110. In addition, the amplitude modulation is divided into various methods including DSB (double side band) and SSB (single side band) methods.

In the case of an ultrasonic speaker, it is generally known that the SSB method causes less distortion of self-demodulated sounds. Specifically, in the case of the DSB method, a distortion rate of a signal that is demodulated increases as a degree of modulation of a modulated wave used to drive an ultrasonic speaker increases. However, in the case of the SSB method, the distortion rate of the signal that is demodulated is almost constant and is lower than that in the DSB method, regardless of the degree of modulation of the modulated wave used to drive the ultrasonic speaker. Therefore, as will be described later, in the present embodiment, the degree of modulation of a modulated wave generated in each frequency band is set to be as large as possible. Thus, in the present embodiment, it is assumed that the SSB method is performed as an example of a modulation method performed by the modulation units 109 and 110.

The band-corresponding volume setting units 113 and 114 have functions of setting gains of amplitudes of modulated waves output from the modulation units 109 and 110. The volume setting unit 115 has a function of setting gains of amplitudes of modulated waves in respective bands at the same time (in common).

The modulated wave amplitude gain control unit 116 has a function of controlling an amplitude gain of the modulated wave amplitude adjustment unit 111, which adjusts the amplitude of a modulated wave generated in the modulation unit 109, on the basis of outputs of the band-corresponding volume setting unit 113 and the volume setting unit 115, and the modulated wave amplitude gain control unit 117 has a function of controlling an amplitude gain of the modulated wave amplitude adjustment unit 112, which adjusts the amplitude of a modulated wave generated in the modulation unit 110, on the basis of outputs of the band-corresponding volume setting unit 114 and the volume setting unit 115.

The modulated wave amplitude adjustment unit 111 has a function of adjusting the amplitude of a modulated wave output from the modulation unit 109 on the basis of the amplitude gain selected in the modulated wave amplitude gain control unit 116 and then outputting the modulated wave, as a driving signal, to the ultrasonic transducer 118, and the modulated wave amplitude adjustment unit 112 has a function of adjusting the amplitude of a modulated wave output from the modulation unit 110 on the basis of the amplitude gain selected in the modulated wave amplitude gain control unit 117 and then outputting the modulated wave, as a driving signal, to the ultrasonic transducer 119.

In the configuration, it is assumed that audio signals are generated in the signal wave generator 101. In the present embodiment, it is assumed that amplitudes of carrier waves within an ultrasonic band generated in the carrier wave supply unit 108 are constant and the degree of modulation is adjusted to amplitudes of the audio signals. Here, the parametric array effect is characterized in that the sound pressure of sounds in the middle and low frequency band is low because the sounds in the middle and low frequency band are not easily demodulated and the sound pressure of sounds in the middle and high frequency band is high because the sounds in the middle and high frequency band are easily demodulated. Accordingly, in order to adjust the ultrasonic speaker system to have sound quality and volume suitable to various audio sources, it is necessary that the sound pressure in the middle and low frequency band be output at a level as high as possible.

In this case, a method of increasing the degree of modulation of a modulated wave that drives an ultrasonic speaker (within a range in which the modulated wave is not overmodulated) may be used to output high sound pressure in the ultrasonic speaker. However, in the case of the ultrasonic speaker, even if the amplitude of a signal wave is made as high as possible within a range in which the modulated wave is not overmodulated, it is difficult to output self-demodulated sounds, having satisfactory sound pressure, in the middle and low frequency band.

Therefore, as already described above, in order to set the degree of modulation in the middle and low frequency band to a large value, it is necessary to divide audio signals into at least two different frequency bands so as to reduce frequency components included in audio signals of each of the bands and to drive ultrasonic transducers, which are provided corresponding to the respective frequency bands, with modulated waves generated in the respective divided frequency bands.

For this reason, in the present embodiment, first, audio signals output from the signal wave generator 101 branch off into two signal paths (circuit systems). One branched group of audio signals are output to the filter (low pass filter) 102 that causes signals in a frequency band lower than a frequency of 4 kHz to pass therethrough. Then, in the filter 102, frequency components in the middle and low frequency band are extracted from the audio signals. In the present embodiment, the signal path is denoted as '1'.

The other branched group of audio signals are output to the filter (high pass filter) 103 that causes signals in a frequency band higher than a frequency of 4 kHz to pass therethrough. Then, in the filter 103, frequency components in the middle and high frequency band are extracted from the audio signals. In the present embodiment, the signal path is denoted as '2'.

First Path

In first path, amplitudes of audio signals, which correspond to middle and low frequency components and have passed through the filter (low pass filter) 102, are also divided into two parts. One part is input to the signal wave amplitude gain control unit 106 and the other part is input to the signal wave amplitude adjustment unit 104. Here, the signal wave amplitude gain control unit 106 has a function of detecting a maximum amplitude value of the audio signals corresponding to the middle and low frequency components. That is, the signal wave amplitude gain control unit 106 controls the amplitude gain of the signal wave amplitude adjustment unit 104 such that the maximum degree of modulation of a modulated wave generated by the modulation unit 109 is constant corresponding to the maximum amplitude value of the audio signals corresponding to the middle and low frequency components.

Figure 3:
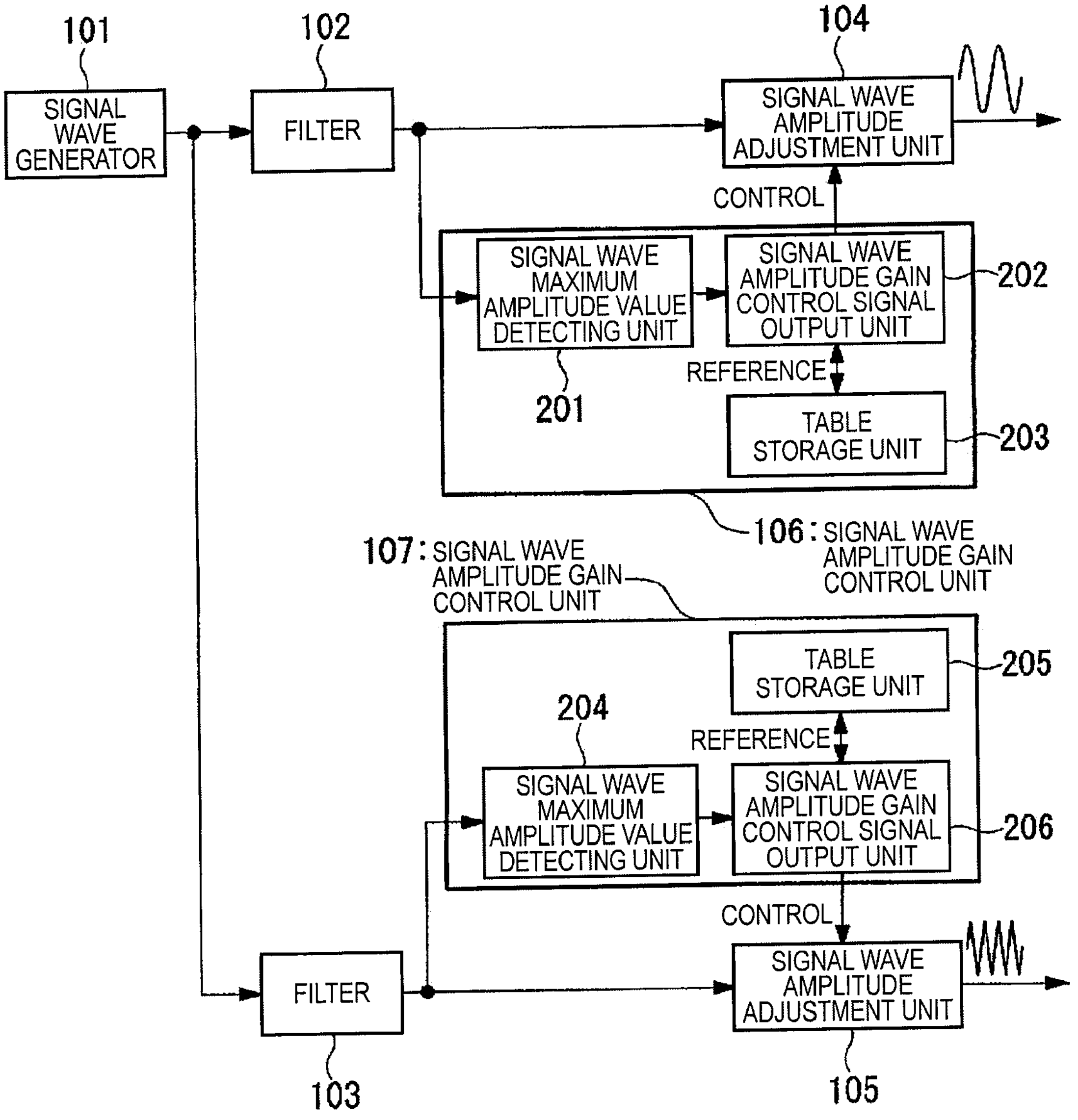
FIG. 3 is a block diagram illustrating the specific configuration of a signal wave amplitude gain control unit in the ultrasonic speaker system shown in FIG. 1.

FIG. 3 illustrates an example of constituent components of the signal wave amplitude gain control unit 106. Referring to FIG. 3, the signal wave amplitude gain control unit 106 is configured to include a signal wave maximum amplitude value detecting unit 201, a signal wave amplitude gain control signal output unit 202, and a table storage unit 203. In FIG. 3, the audio signals corresponding to middle and low frequency components are input to the signal wave maximum amplitude value detecting unit 201.

The signal wave maximum amplitude value detecting unit 201 has a function of detecting the maximum amplitude value of the audio signals corresponding to middle and low frequency components every two seconds, for example. At this time, setting is made such that a signal wave is delayed for two seconds and is then output, for example, by using a memory provided between the filter 102 and the signal wave amplitude adjustment unit 104.

Figures 4A, 4B:
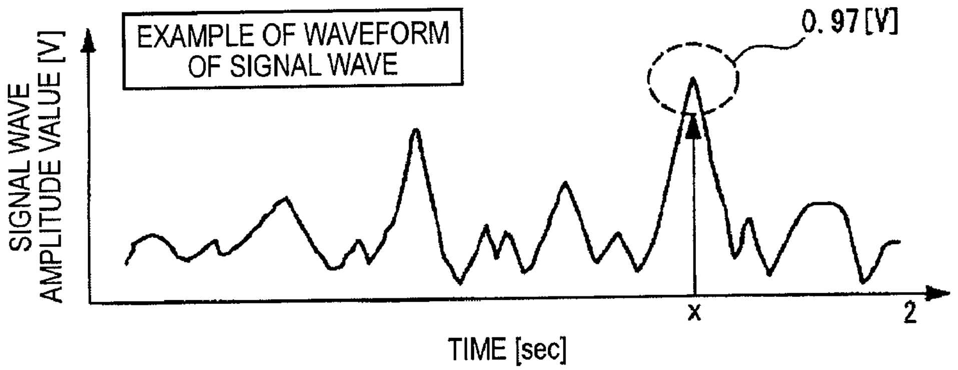
FIG. 4A is a view illustrating the relationship between a maximum amplitude value of a signal wave and a signal wave amplitude gain control signal that specifies an amplitude gain of a signal wave amplitude adjustment unit.
FIG. 4B is a view illustrating an example of the waveform of a signal wave.

Further, the signal wave amplitude gain control signal output unit 202 has a function of outputting a signal wave amplitude gain control signal to the signal wave amplitude adjustment unit 104 by referring to a table in FIG. 4A stored beforehand in the table storage unit 203. Here, FIG. 4A illustrates the relationship between the maximum amplitude value of audio signals and the signal wave amplitude gain control signal that specifies the amplitude gain of the signal wave amplitude adjustment unit 104. The signal wave amplitude adjustment unit 104 amplifies amplitudes of the audio signals, which belong to the middle and low frequency bands, with gains shown in FIG. 4A on the basis of the signal wave amplitude gain control signal and then outputs the amplified signals. The table shown in FIG. 4A corresponds to the first table.

In the present embodiment, the table in FIG. 4A is created such that the maximum degree of modulation of modulated waves generated in the first path is constant by about 90%, for example. For example, a case is assumed in which an audio signal (signal wave) having waveform shown in FIG. 4B is input to the signal wave maximum amplitude value detecting unit 201 shown in FIG. 3 for two seconds. Referring to FIG. 4B, it is detected that the maximum amplitude value is 0.97 V at a point of time of an x second, for example. As a result, referring to FIG. 4A, a control signal of '01010' is output from the signal wave amplitude gain control signal output unit 202, and thus the amplitude gain of the signal wave amplitude adjustment unit 104 is determined.

In modulated waves that drive an ultrasonic transducer by using the system described above, it is possible to maintain the constant degree of modulation regardless of the maximum amplitude value of audio signals. As a result, it is possible to prevent the modulated waves from being overmodulated. In addition, since it is possible to maintain the degree of modulation constant and high, a self-demodulated sound having a high sound pressure level can be output from an ultrasonic transducer even if the amplitudes of the modulated waves are made smaller. As a result, it is possible to suppress power consumption to be low.

By using the audio signals (signal waves) corresponding to middle and low frequency components output from the signal wave amplitude adjustment unit 104, the modulation unit 109 modulates carrier waves output from the carrier wave supply unit 108 so as to generate a modulated wave 1.

Second Path

In second path, amplitudes of audio signals, which correspond to middle and high frequency components and have passed through the filter (high pass filter) 103, are also divided into two parts. One part is input to the signal wave amplitude gain control unit 107 and the other part is input to the signal wave amplitude adjustment unit 105. Similar to the case of the first path, an example of constituent components of the signal wave amplitude gain control unit 107 is shown in FIG. 3.

Referring to FIG. 3, the signal wave amplitude gain control unit 107 is configured to include a signal wave maximum amplitude value detecting unit 204, a signal wave amplitude gain control signal output unit 205, and a table storage unit 206. In the same order as shown in the case of the first path, the signal wave amplitude adjustment unit 105 adjusts amplitudes of audio signals corresponding to middle and high frequency components (on the basis of an output of the signal wave amplitude gain control unit 107) such that the modulation of modulated waves in the second path becomes about 90%, for example. In addition, by using the audio signals corresponding to middle and high frequency components output from the signal wave amplitude adjustment unit 105, the modulation unit 110 modulates carrier waves output from the carrier wave supply unit 108 so as to generate a modulated wave 2.

The modulated waves generated in the first and second paths are input to the modulated wave amplitude adjustment units 111 and 112, respectively. However, in the present embodiment, the signal waves are divided corresponding to bands by the use of the first path and the second path and signal processing is executed corresponding to each of the bands. This causes a problem in which an adjustment to proper sound quality and volume with respect to various audio signals is not easily made, unlike the device disclosed in JP-A-6-216681.

Specifically, in the present embodiment, adjustment of amplitudes of modulated waves within middle and low frequency bands in the first path corresponds to adjustment of the base referred in the device disclosed in JP-A-6-216681, and adjustment of amplitudes of modulated waves within middle and high frequency bands in the second path corresponds to adjustment of the treble referred in the device disclosed in JP-A-6-216681. However, in this case, a problem occurs in that there is no function of simultaneously adjusting the volume from ultrasonic speakers corresponding to the respective frequency bands under the state in which the adjustment of the amplitudes of modulated waves is completed corresponding to the respective frequency bands and desired balance (that is, sound quality) of the middle and low band and the middle and high band is maintained.

Therefore, a method is considered in which the plurality of band-corresponding volume setting units 113 and 114 that adjust the amplitudes of modulated waves corresponding to the respective frequency bands and the overall volume setting unit 115 that simultaneously adjusts the amplitudes of modulated waves corresponding to the respective frequency bands are provided and gains of the amplitudes of the modulated waves corresponding to the respective frequency bands are determined on the basis of two parameters of the band-corresponding volume setting units corresponding to the respective frequency bands and the overall volume setting unit.

Figure 5:
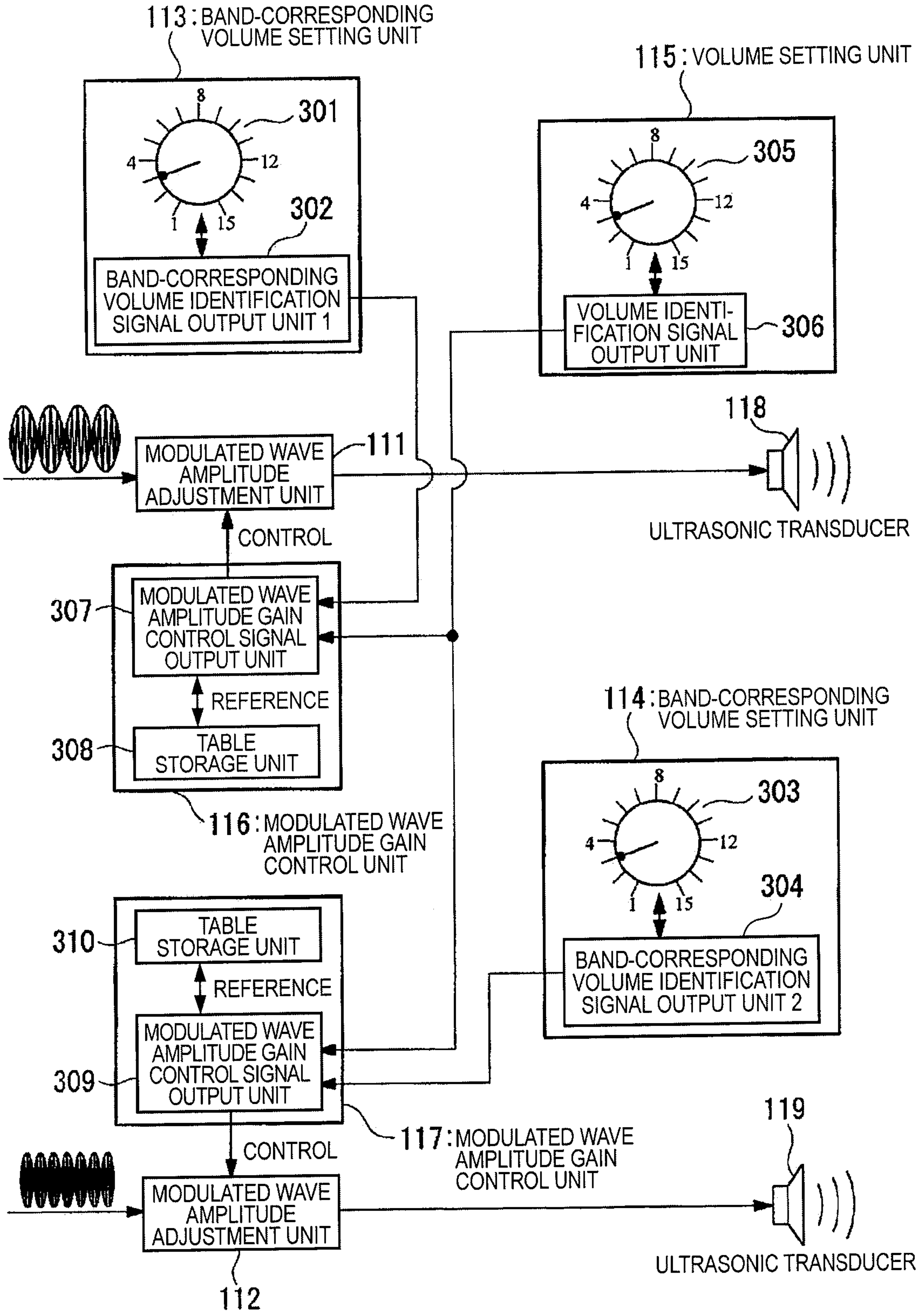
FIG. 5 is a block diagram illustrating the specific configuration of band-corresponding volume setting units and a volume setting unit in the ultrasonic speaker system shown in FIG. 1.

Here, examples of the configurations of the band-corresponding volume setting units 113 and 114 and the volume setting unit 115 are shown in FIG. 5. Referring to FIG. 5, the band-corresponding volume setting unit 113 is configured to include a band-corresponding volume setting knob 301 and a band-corresponding volume identification signal output unit 302, the band-corresponding volume setting unit 114 is configured to include a band-corresponding volume setting knob 303 and a band-corresponding volume identification signal output unit 304, and the volume setting unit 115 is configured to include a volume setting knob 305 and a volume identification signal output unit 306. As an example, the band-corresponding volume setting knobs 301 and 303 and the volume setting knob 305 are designed to be adjustable with 15-step distances, as shown in FIG. 5.

In addition, the band-corresponding volume identification signal output units 302 and 304 and the volume identification signal output unit 306 shown in FIG. 5 have functions of outputting, for example, identification signals shown in FIGS. 6A to 6C according to states of the band-corresponding volume setting knobs 301 and 303 and the volume setting knob 305, respectively.

Here, for example, in the case when an indicator of the band-corresponding volume setting knob 301 is set to '4', a first band-corresponding volume identification signal of '0100' is output, which is shown in FIG. 6A. Similarly, for example, in the case when an indicator of the band-corresponding volume setting knob 305 is set to '1', a volume identification signal of '0001' is output, which is shown in FIG. 6C.

It will now be described about the modulated wave amplitude gain control unit 116 that controls the amplitude gain of the first modulated wave, which is an output of the modulation unit 109, on the basis of two identification signals of the first band-corresponding volume identification signal and the volume identification signal and the modulated wave amplitude gain control unit 117 that controls the amplitude gain of the second modulated wave, which is an output of the modulation unit 110, on the basis of two identification signals of the second band-corresponding volume identification signal and the volume identification signal.

Here, examples of constituent components of the modulated wave amplitude gain control units 116 and 117 that control the amplitude gains of the modulated wave amplitude adjustment units 111 and 112 are shown in FIG. 5.

Referring to FIG. 5, the modulated wave amplitude gain control unit 116 is configured to include a modulated wave amplitude gain control signal output unit 307 and a table storage unit 308. Furthermore, referring to FIG. 5, the modulated wave amplitude gain control unit 117 is configured to include a modulated wave amplitude gain control signal output unit 309 and a table storage unit 310.

In this case, the modulated wave amplitude gain control unit 116 outputs a 'first modulated wave amplitude gain control signal' from the modulated wave amplitude gain control signal output unit 307 on the basis of a table in FIG. 7A stored beforehand in the table storage unit 308, the table corresponding according to the states of two identification signals of the first band-corresponding volume identification signal output from the band-corresponding volume identification signal output unit 302 and the volume identification signal output from the volume identification signal output unit 306. Moreover, the modulated wave amplitude adjustment unit 111 adjusts the amplitude of the first modulated wave generated in the first path on the basis of information of the 'modulated wave amplitude gain control signal 1'.

Similarly, the modulated wave amplitude gain control unit 117 outputs a 'second modulated wave amplitude gain control signal' from the modulated wave amplitude gain control signal output unit 309 on the basis of a table in FIG. 7B stored beforehand in the table storage unit 310, the table corresponding according to the states of two identification signals of the second band-corresponding volume identification signal output from the band-corresponding volume identification signal output unit 304 and the volume identification signal output from the volume identification signal output unit 306. Moreover, the modulated wave amplitude adjustment unit 112 adjusts the amplitude of the second modulated wave generated in the path 2 on the basis of information of the 'second modulated wave amplitude gain control signal'.

The band-corresponding volume identification signals output from the band-corresponding volume setting units 113 and 114 correspond to the band-corresponding volume setting data, and the volume identification signal output from the volume setting unit (overall volume setting unit) 115 corresponds to the overall volume setting data. The tables shown in FIGS. 7A and 7B correspond to the second table.

Figures 8A, 8B:
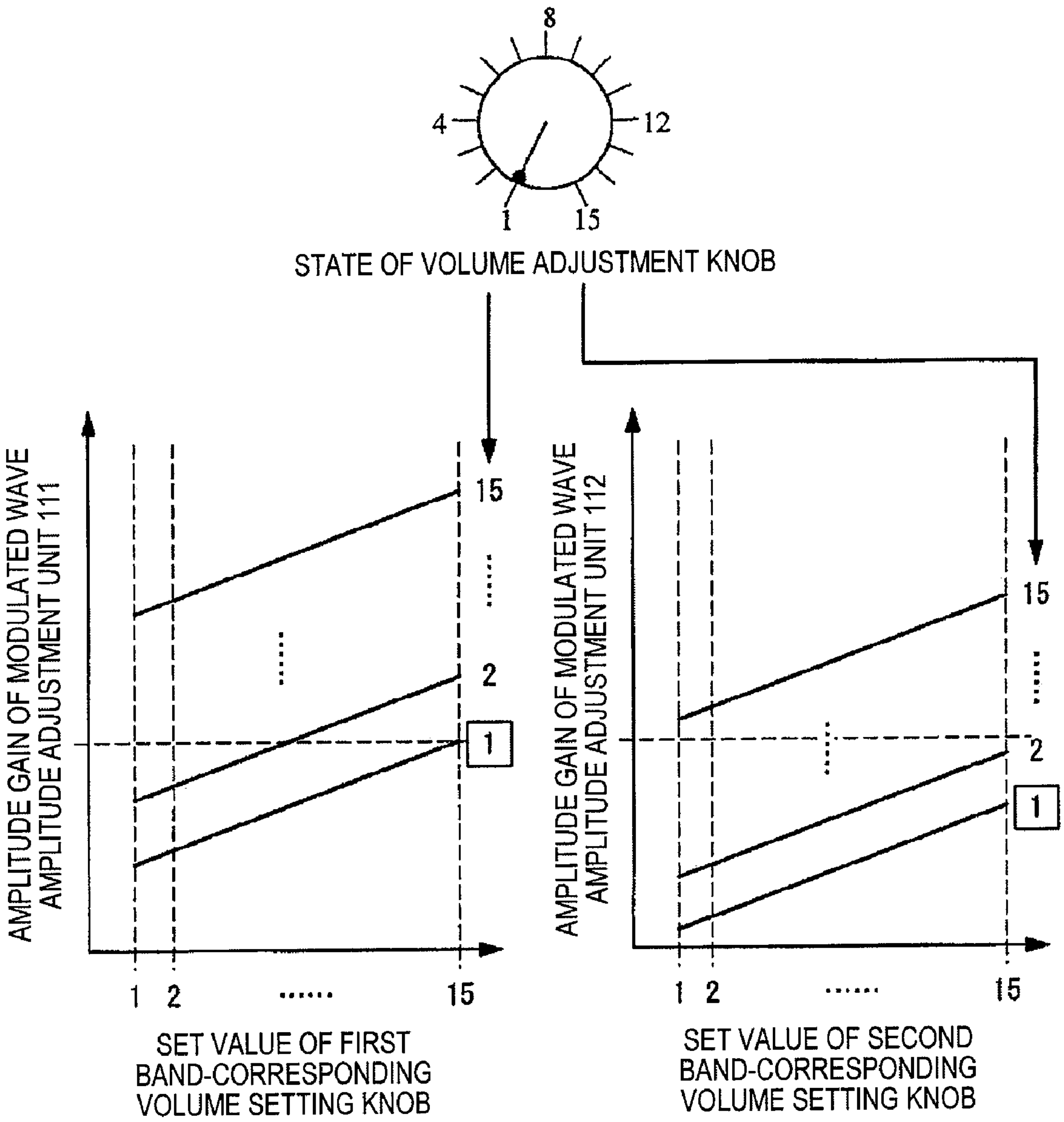
FIG. 8A is a characteristic view illustrating the relationship between a set value of a band-corresponding volume setting knob and an amplitude gain of a modulated wave amplitude adjustment unit by using a set value of a volume setting knob as a parameter.
FIG. 8B is a characteristic view illustrating the relationship between a set value of a band-corresponding volume setting knob and an amplitude gain of a modulated wave amplitude adjustment unit by using a set value of a volume setting knob as a parameter.

Furthermore, as an example, the table shown in FIG. 7A is created on the basis of a straight line (or a curve) in which an amplitude gain of the modulated wave amplitude adjustment unit 111 monotonically increases as a set value of the band-corresponding volume setting knob 301 increases, as shown in FIG. 8A. In addition, the table shown in FIG. 7A is created such that amplitude gains of the modulated wave amplitude adjustment unit 111 in the case of a minimum set value and a maximum set value of the band-corresponding volume setting knob 301 monotonically increase, respectively, as a set value of the volume setting knob increases, as shown in FIG. 8A.

Similarly, the table shown in FIG. 7B is created on the basis of a straight line (or a curve) in which an amplitude gain of the modulated wave amplitude adjustment unit 112 monotonically increases as a set value of the band-corresponding volume setting knob 303 increases, as shown in FIG. 8B. In addition, the table shown in FIG. 7B is created such that amplitude gains of the modulated wave amplitude adjustment unit 111 in the case of a minimum set value and a maximum set value of the band-corresponding volume setting knob 303 monotonically increase, respectively, as the set value of the volume setting knob increases, as shown in FIG. 8B. [0096] In this case, due to design of a slope of a straight line (or a curve) shown in FIG. 8A, a rate of change of an amplitude value of the first modulated wave when changing the set value of the band-corresponding volume setting knob 301, that is, the rate of change of volume in the middle and low frequency band varies. For example, the larger the slope of the straight line (or curve) shown in FIG. 8A is, the larger variation of volume in the middle and low frequency band when changing the band-corresponding volume setting knob 301 is. Similarly, due to design of a slope of a straight line (or a curve) shown in FIG. 8B, a rate of change of an amplitude value of the second modulated wave when changing the band-corresponding volume setting knob 303, that is, the rate of change of volume in the middle and high frequency band varies.

Moreover, in the present embodiment, the ultrasonic transducers that are provided corresponding to respective frequency bands are driven. Here, a self-demodulated sound in the ultrasonic speaker is characterized in that a sound pressure level in the middle and low frequency band is lower than a sound pressure level in the middle and high frequency band.

Therefore, in the present embodiment, as for each set value of the volume setting knob 305, the tables shown in FIGS. 7A and 7B are designed such that even when set values of the band-corresponding volume setting knobs 301 and 303 are equal, an amplitude gain (corresponding to FIG. 8A) of the modulated wave amplitude adjustment unit 111 in the middle and low frequency band is larger than an amplitude gain (corresponding to FIG. 8B) of the modulated wave amplitude adjustment unit 112 in the middle and high frequency band, as shown in FIGS. 8A and 8B. Due to such design, a reference of volume balance of a self-demodulated sound emitted from each of the ultrasonic transducers, which are provided corresponding to respective frequency bands, is determined.

Furthermore, in the present embodiment, the tables shown in FIGS. 7A and 7B are designed such that even when the band-corresponding volume setting knobs 301 and 303 are set to have predetermined values corresponding to change of a set value of the volume setting knob 305, the amplitude gains of the modulated wave amplitude adjustment units 111 and 112 are determined so that sound pressure levels in the middle and low frequency band and the middle and high frequency band change with the same level.

That is, in the present embodiment, for example, in a state in which the volume setting knob 305 is set to '4', it is possible to keep sound balance (here, as an example, it is assumed that sound pressure levels of self-demodulated sounds in the middle and low frequency band and the middle and high frequency band are approximately equal to each other) of the middle and low frequency band and the middle and high frequency band by adjusting the band-corresponding volume setting knobs 301 and 303. In addition, the volume in the middle and low frequency band or the volume in the middle and high frequency band can be raised by adjusting the band-corresponding volume setting knobs, that is, it is possible to easily adjust the sound quality similar to a typical audio device.

In addition, by adjusting a value of the volume setting knob to a value larger than '4' after making an adjustment to desired sound quality in the method described above, it is possible to simultaneously increase volumes of ultrasonic speakers provided corresponding to respective bands while maintaining the same sound quality.

By using the system described above, it is possible to easily make an adjustment to proper sound quality and volume with respect to audio signals in the ultrasonic speaker. In addition, it is possible to prevent an overvoltage from being applied to ultrasonic transducers by setting beforehand an upper limit of an amplitude gain of a modulated wave.

In the ultrasonic speaker system according to the embodiment of the invention, an adjustment can be made such that sounds in the middle and low frequency band are output to the maximum, an adjustment to proper sound quality and volume with respect to audio signals can be easily made, it is possible to prevent modulated waves from being overmodulated, and it is possible to prevent an overvoltage from being applied to an ultrasonic transducer, and power consumption required for driving the system is low.

Second Embodiment

In the first embodiment of the invention, an example of the ultrasonic speaker system has been described. In the second embodiment of the invention, an example of an ultrasonic speaker system using a push-pull type electrostatic transducer will be described.

Figure 9A:
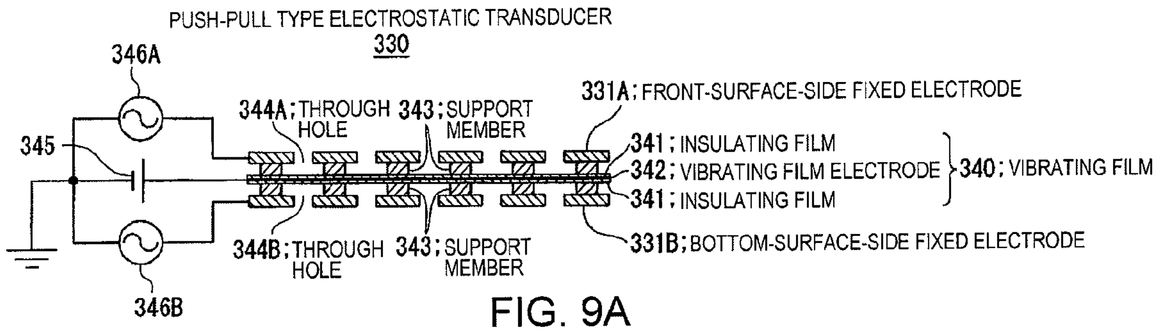
FIG. 9A is a view illustrating an example of a push-pull type electrostatic transducer.
Figure 9B:
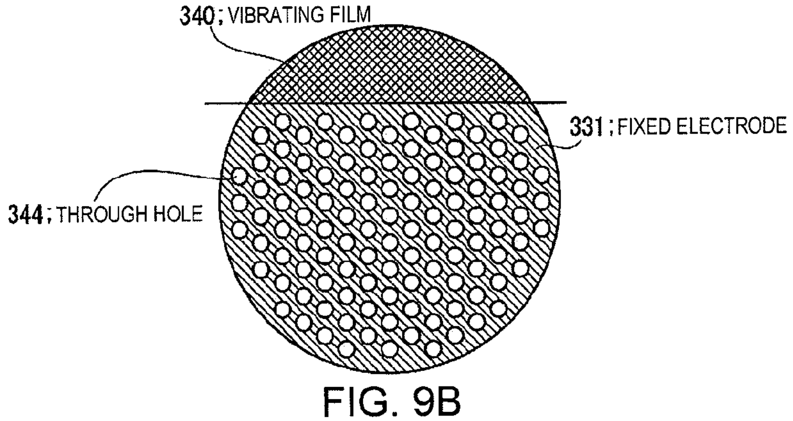
FIG. 9B is a view illustrating an example of a push-pull type electrostatic transducer.

FIGS. 9A and 9B are views illustrating an example of an electrostatic transducer driven in an ultrasonic speaker system according to the embodiment of the invention. In particular, the electrostatic transducer has a structure suitable for being used as a transducer of an ultrasonic speaker. FIG. 9A illustrates a cross-sectional surface of an electrostatic transducer 330. The electrostatic transducer 330 includes: a vibrating film 340 having a conductive layer; and a pair of fixed electrodes including a front-surface-side fixed electrode 331A and a bottom-surface-side fixed electrode 331B (referred to as a fixed electrode 331 in the case of indicating both the front-surface-side fixed electrode 331A and the bottom-surface-side fixed electrode 331B) that are provided opposite to surfaces of the corresponding vibrating film 340. As shown in FIG. 9A, the vibrating film 340 is formed such that a conductive film (vibrating film electrode) 342 that forms an electrode is interposed between insulating films 341.

Furthermore, with the vibrating film 340 interposed between the front-surface-side fixed electrode 331A and the bottom-surface-side fixed electrode 331B, the front-surface-side fixed electrode 331A is provided with a plurality of through holes 344A and the bottom-surface-side fixed electrode 331B is provided with through holes 344B that have the same shape and are located opposite to the through holes 344A provided in the front-surface-side fixed electrode 331A (referred to as a through hole 344 in the case of indicating both the through hole 344A and the through hole 344B). The front-surface-side fixed electrodes 331A and the bottom-surface-side fixed electrodes 331B are supported by support members 343 with a predetermined gap between the vibrating film 340 and each of the front-surface-side fixed electrodes 331A and the bottom-surface-side fixed electrodes 331B. The support member 343 is formed such that the vibrating film 340 and the fixed electrode are opposite to each other with a gap therebetween. FIG. 9B illustrates an external appearance of a surface of a transducer in plan view (a state in which a part of the fixed electrodes 331 is notched to expose the vibrating film 340). In this case, the plurality of through holes 344 is arranged in a beehive shape.

Furthermore, a DC power supply 345 is a power supply used to apply a DC bias voltage to the vibrating film electrode 342, and AC signals 346A and 346B are signals applied to the front-surface-side fixed electrodes 331A and the bottom-surface-side fixed electrodes 331B in order to drive the vibrating film 340. With the configuration described above, AC signals 346A and 346B whose amplitudes are equal and phases are inverted with a center tap as a reference are applied to the front-surface-side fixed electrodes 331A and the bottom-surface-side fixed electrodes 331B of the electrostatic transducer 330, respectively.

Thus, by applying a DC bias voltage E to the vibrating film electrode 342 and applying driving signals (AC signals), of which phases are inverted with respect to each other, to the front-surface-side fixed electrodes 331A and the bottom-surface-side fixed electrodes 331B, an electrostatic suction force and an electrostatic repelling force work on the vibrating film simultaneously in the same direction. In addition, whenever a polarity of the driving signal (AC signal) is inverted, the direction in which the electrostatic suction force and the electrostatic repelling force work changes, and accordingly, the vibrating film is push-pull driven. As a result, a sound wave occurring in the vibrating film is emitted to the outside through the through holes 344 provided in the front-surface-side fixed electrodes 331A and the bottom-surface-side fixed electrodes 331B.

As described above, since the direction in which an electrostatic force works alternately changes while the vibrating film 340 is applied with the electrostatic suction force and the electrostatic repelling force in the same direction according to the change of the polarity of an AC signal, it is possible to generate sound signals having sound pressure levels that are sufficient to obtain large film vibration, that is, the parametric array effect. Thus, the electrostatic transducer 330 shown in FIG. 9A is called a push-pull type transducer, from a point of view in which forces from the pair of fixed electrodes 331A and 331B are applied to the vibrating film 340 so as to vibrate the vibrating film 340.

Figure 10:
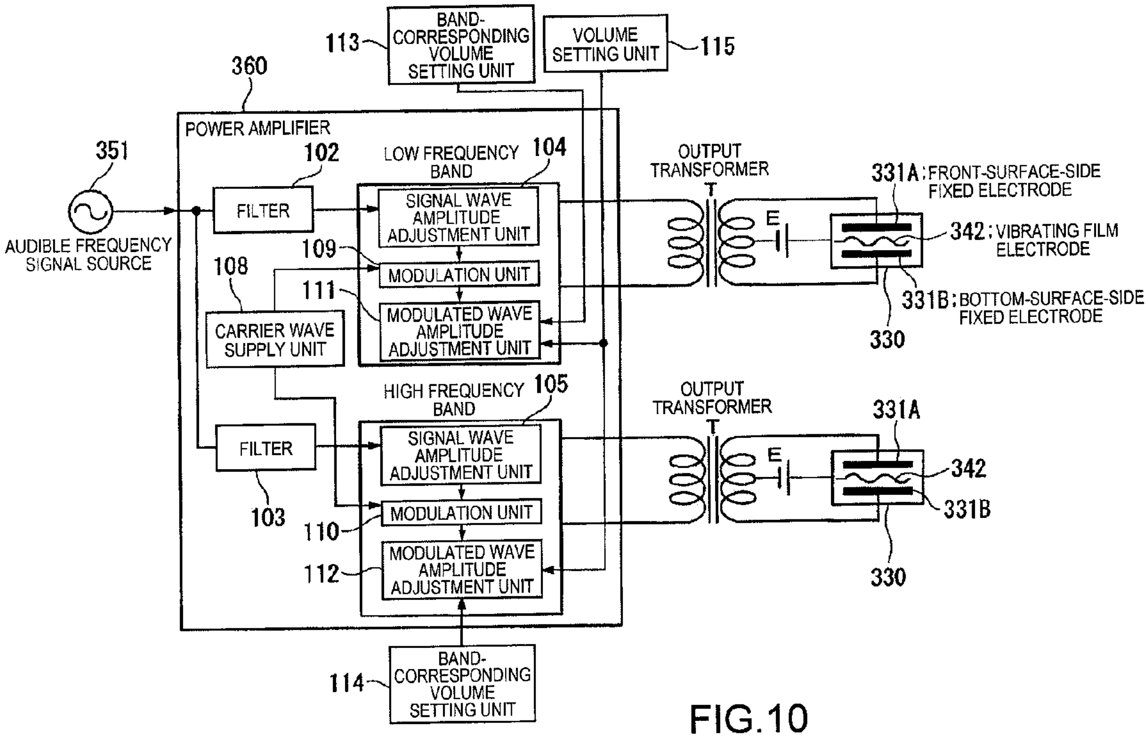
FIG. 10 is a view illustrating an example of the configuration of an ultrasonic speaker using an electrostatic transducer.

Moreover, FIG. 10 is a view illustrating an example of the configuration of an ultrasonic speaker system using the push-pull type electrostatic transducer shown in FIGS. 9A and 9B. The ultrasonic speaker system shown in FIG. 10 includes an audible frequency signal source (audio signal source) 351 that generates signal waves in an audible frequency band, a power amplifier 360, and two electrostatic transducers 330.

The power amplifier 360 has the same configuration as a block surrounded by a solid line in FIG. 1. Here, the carrier wave supply unit 108, the signal wave amplitude gain control units 106 and 107, and the modulated wave amplitude gain control units 116 and 117 shown in FIG. 1 are omitted to improve the viewability of the drawing.

In the power amplifier 360, audio signals (signal waves) output from the audible frequency signal source 351 are divided into two frequency bands of a low frequency band and a high frequency band by the filters 102 and 103 and the amplitude of a signal wave and the amplitude of a modulated wave are separately adjustable for each of the divided frequency bands.

Low-frequency-band modulated signals and high-frequency-band modulated signals output from the power amplifier 360 are applied to both ends of a primary coil of an output transformer T, respectively, such that the electrostatic transducers 330 connected to a secondary coil of the output transformer T are driven. Furthermore, the output transformer T has an intermediate tap provided in the secondary coil, and a DC bias voltage E is applied between the intermediate tap and the vibrating film electrode 342.

In the configuration described above, it is possible to set modulated waves in respective frequency bands with a large degree of modulation by dividing frequency components included in signals within the respective bands into high-frequency-band components and low-frequency-band components by causing the audio signals to pass through two band pass filters 102 and 103, making the frequency components included in signals within the respective bands smaller than frequency components included in original audio signals, modulating carrier waves with respective high-frequency-band signal waves and low-frequency-band signal waves, and driving different ultrasonic transducers 330 with low-frequency-band modulated waves and high-frequency-band modulated waves. As a result, an adjustment can be made such that sounds in the middle and low frequency band are output to the maximum, and an adjustment to proper sound quality and volume with respect to audio signals can be easily made. Further, it is possible to prevent modulated waves from being overmodulated, to prevent an overvoltage from being applied to an ultrasonic transducer, and to drive the ultrasonic transducer with low power consumption.

Furthermore, in the electrostatic transducers 330, modulated signals are converted into sound waves having limited amplitude levels and then the sound waves are radiated to the medium (air). As a result, original signal sounds in the audible frequency band are self-reproduced due to the non-linearity effect of the medium (air). Specifically, the electrostatic transducers 330 is based on a principle in which the sound wave is a sparse and dense wave that propagates by using air as a medium, the sound speed is fast in a dense part but slow in a sparse part due to a noticeable difference between the dense part and the sparse part of the air while a modulated ultrasonic wave is propagating which distorts the modulated wave, and as a result, the modulate ultrasonic wave is separated into a carrier wave (ultrasonic wave) and an audible wave (original audio signal) and human beings can hear only an audible sound (original audio signal) equal to or smaller than a frequency of 20 kHz. This principle is generally called the parametric array effect.

Third Embodiment

Next, it will be described about a display device using the ultrasonic speaker according to the embodiment of the invention, that is, a display device using an ultrasonic speaker that can be adjustable such that sounds in the middle and low frequency band are output to the maximum and can easily make an adjustment to proper sound quality and volume with respect to audio signals.

Hereinafter, a projector, which is an example of the display device according to the embodiment of the invention, will be described. In addition, the display device according to the embodiment of the invention is not limited to the projector but may be applied to various display devices that reproduce sound and image.

Figure 11:
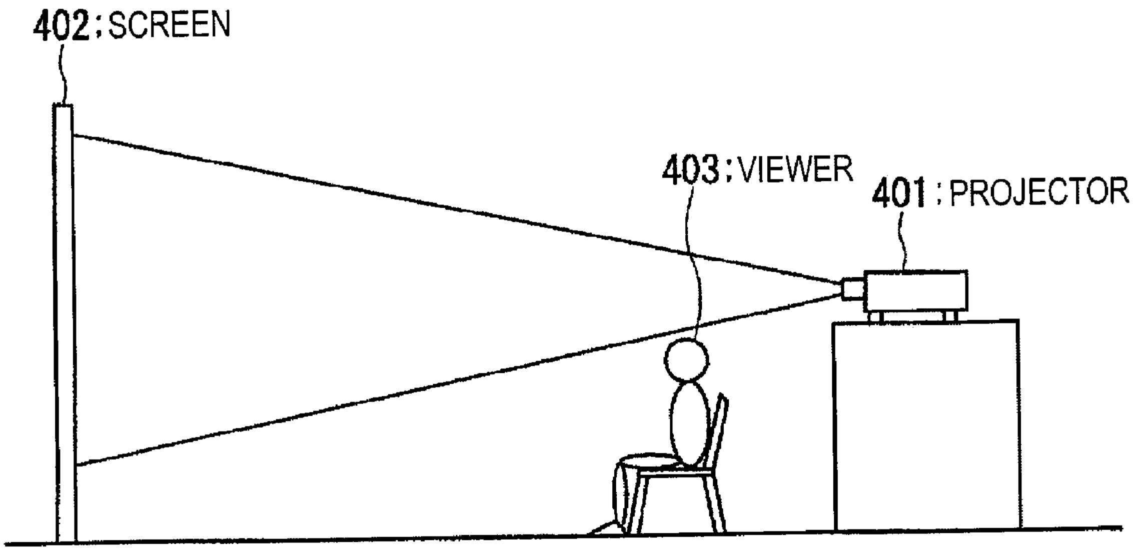
FIG. 11 is a view illustrating a state in which a projector is used.

FIG. 11 illustrates a state in which the projector (display device) according to the embodiment of the invention is used. As shown in FIG. 11, a projector 401 is disposed at a rear side of a viewer 403. The projector 401 is configured such that an image is projected onto a screen 402 disposed at a front side of the viewer 403 and a virtual sound source is formed on a projected surface of the screen 402 by means of an ultrasonic speaker mounted in the projector 401, and thus a sound is reproduced.

Figure 12A:
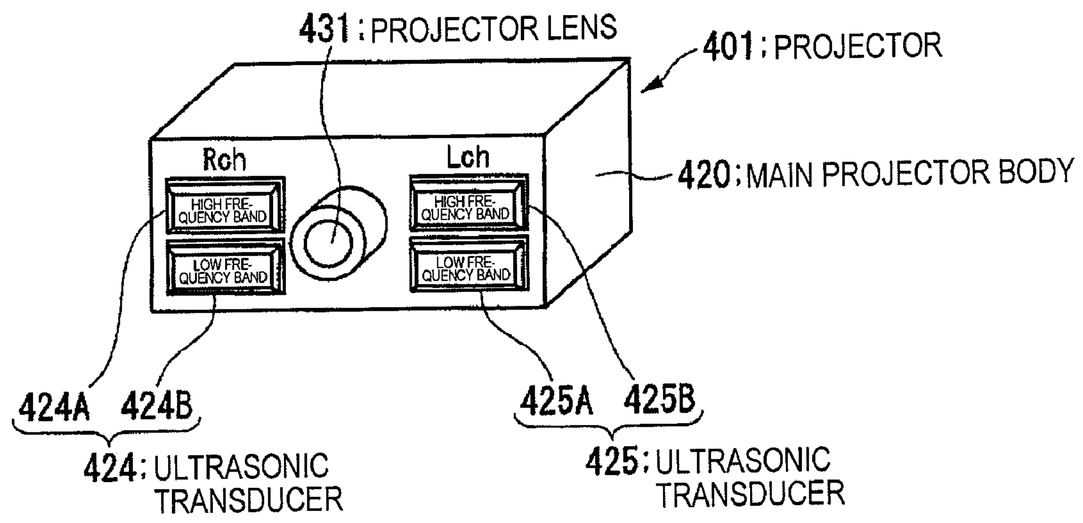
FIG. 12A is a view illustrating the external configuration of the projector shown in FIG. 11.
Figure 12B:
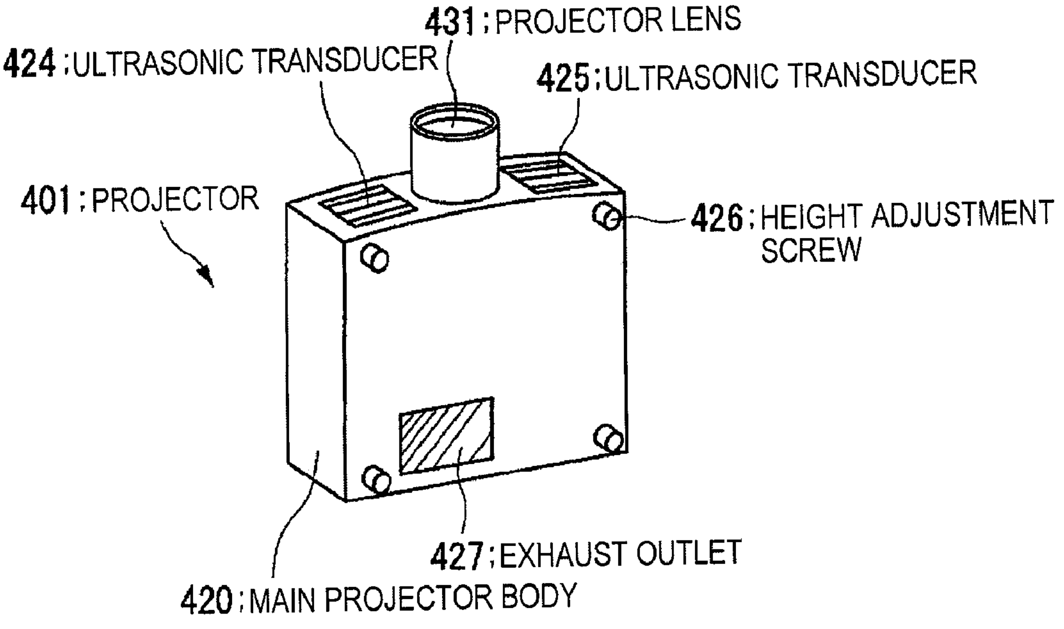
FIG. 12B is a view illustrating the external configuration of the projector shown in FIG. 11.

An external configuration of the projector 401 is shown in FIGS. 12A and 12B. The projector 401 is configured to include a main projector body 420 having a projection optical system that projects an image onto a projected surface, such as a screen, and ultrasonic transducers 424 and 425 capable of oscillating sound waves in an ultrasonic frequency band. In addition, the projector 401 is integrally formed together with an ultrasonic speaker that reproduces signal sounds in the audible frequency band from sound signals supplied from the sound source. In the present embodiment, in order to reproduce a stereo sound signal, the ultrasonic transducers 424 and 425 that form an ultrasonic speaker and are located on left and right sides of a projector lens 431 forming the projection optical system are mounted in the main projector body.

In addition, reference numeral 426 denotes a height adjustment screw used to adjust the height of the main projector body 420, and reference numeral 427 denotes an exhaust outlet for an air cooling fan.

In addition, the ultrasonic transducers 424 and 425 that form the ultrasonic speaker are formed by using the ultrasonic speaker system according to the embodiment of the invention. The right (Rch) ultrasonic transducer 424 is configured to include a high-frequency-band ultrasonic transducer 424A, which is driven by modulated signals obtained by modulating carrier waves with high-frequency-band signals, and a low-frequency-band ultrasonic transducer 424B, which is driven by modulated signals obtained by modulating carrier waves with low-frequency-band signals. Similarly, the left (Lch) ultrasonic transducer 425 is configured to include a high-frequency-band ultrasonic transducer 425A, which is driven by modulated signals obtained by modulating carrier waves with high-frequency-band signals, and a low-frequency-band ultrasonic transducer 425B, which is driven by modulated signals obtained by modulating carrier waves with low-frequency-band signals.

In addition, each of the ultrasonic transducers 424A, 424B, 425A, and 425B is configured by using the push-pull type electrostatic transducer shown in FIGS. 9A and 9B and can oscillate sound signals (sound waves in the ultrasonic frequency band) in a broad frequency band with high sound pressure.

Accordingly, by changing frequencies of carrier waves so as to control a spatial reproduction range of reproduced signals in the audible frequency band, it is possible to realize a sound effect, which can be obtained in a stereo surround system or 5.1 channel surround system, without a large-scale sound system that has been required in the related art, and to implement a projector that can be easily carried.

Figure 13:
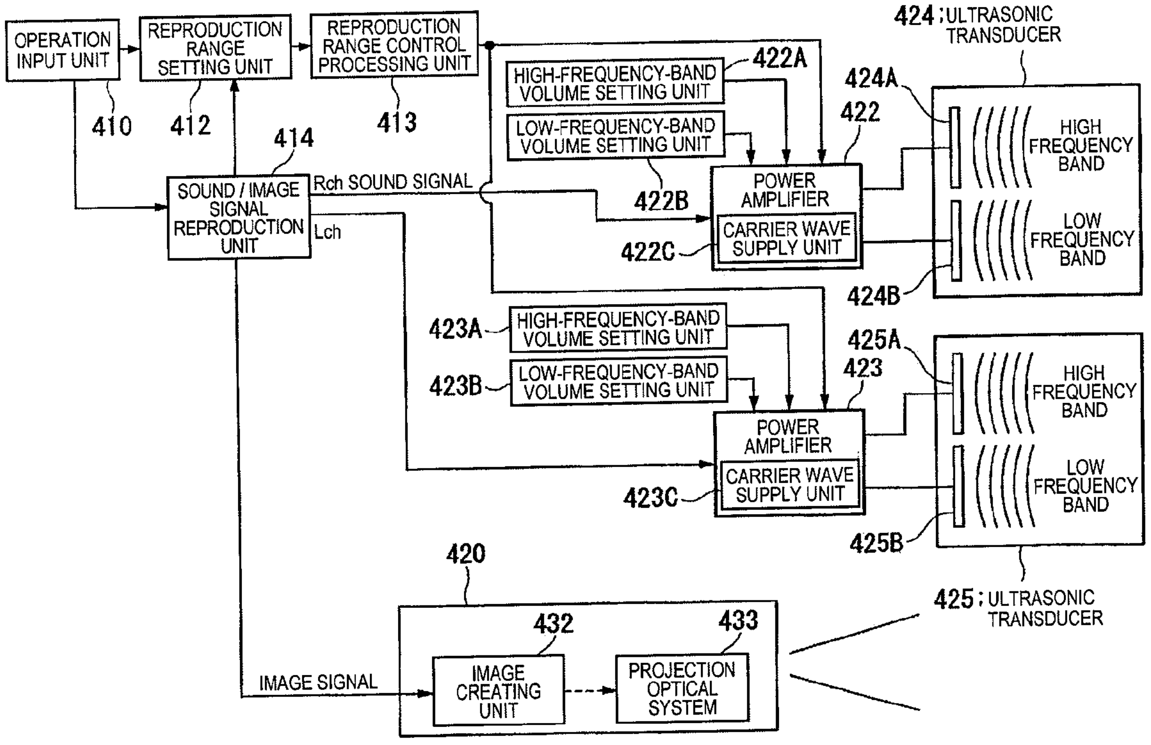
FIG. 13 is a view illustrating an example of the electrical configuration of the projector shown in FIG. 11.

Next, an electrical configuration of the projector 401 is shown in FIG. 13. The projector 401 includes an operation input unit 410, a reproduction range setting unit 412, a reproduction range control processing unit 413, a sound/image signal reproduction unit 414, power amplifiers 422 and 423, an ultrasonic speaker having ultrasonic transducers 424 and 425, and a main projector body 420. In addition, the power amplifiers 422 and 423 are configured to include a driving circuit of the ultrasonic speaker system, which is shown in FIG. 1, according to the embodiment of the invention. In addition, each of the ultrasonic transducers 424 and 425 is configured to include a pair of high-frequency-band electrostatic transducer and low-frequency-band ultrasonic transducer.

Moreover, the power amplifiers 422 and 423 include carrier wave supply units 422C and 423C (refer to the carrier wave supply unit 108 in FIG. 1), respectively. In addition, the power amplifiers 422 and 423 are configured such that frequencies of carrier waves supplied from the carrier wave supply units 422C and 423C are controllable by the reproduction range control processing unit 413.

Furthermore, the power amplifier 422 includes a high-frequency-band volume setting unit 422A used to adjust the volume in the high frequency band and a low-frequency-band volume setting unit 422B used to adjust the volume in the low frequency band. Similarly, the power amplifier 423 includes a high-frequency-band volume setting unit 423A used to adjust the volume in the high frequency band and a low-frequency-band volume setting unit 423B used to adjust the volume in the low frequency band. Thus, it is possible to perform a balance adjustment on the volume in the high frequency band and the volume in the low frequency band.

The main projector body 420 includes an image creating unit 432 that creates an image and a projection optical system 433 that projects a created image onto a projected surface. The projector 401 is configured to include the ultrasonic speaker and the main projector body 420 that are integrally formed.

The operation input unit 410 includes various function keys having a ten key, a numeric key, and a power key used to power on/off. The reproduction range setting unit 412 is configured such that a user can input data specifying the reproduction range of a reproduced signal (signal sound) by operating a key of the operation input unit 410 and a frequency of a carrier wave specifying the reproduction range of the reproduced signal is set and held if the data is input. Setting of the reproduction range of the reproduced signal is performed by specifying the distance by which the reproduced signal propagates from sound wave radiating surfaces of the ultrasonic transducer 424 and 425 in the radiation-axis direction.

In addition, the reproduction range setting unit 412 is configured such that frequencies of carrier waves generated in the carrier wave supply units 422C and 423C are set by a control signal that is output from the sound/image signal reproduction unit 414 in correspondence with details of images.

In addition, the reproduction range control processing unit 413 has a function of referring to set details of the reproduction range setting unit 412 and making a control such that the frequencies of the carrier waves generated in the carrier wave supply units 422C and 423C within the power amplifiers 422 and 423 are changed to fall within the set reproduction range.

For example, in the case when the distance corresponding to the carrier wave frequency of 50 kHz is set as existing information of the reproduction range setting unit 412, the reproduction range control processing unit 413 makes a control such that the carrier wave supply units 422C and 423C oscillate at a frequency of 50 kHz.

The reproduction range control processing unit 413 has a storage unit in which a table indicating the relationship between the distance for specifying the reproduction range, by which the reproduced signal propagates from the sound wave radiating surfaces of the ultrasonic transducers 424 and 425 in the radiation-axis direction, and the frequency of the carrier wave is stored beforehand. Data of the table can be obtained by actually measuring the relationship between the frequency of the carrier wave and the reaching distance of the reproduced signal.

The reproduction range control processing unit 413 obtains a frequency of a carrier wave corresponding to the distance information set by referring to the table on the basis of the set details of the reproduction range setting unit 412 and controls the carrier wave supply units 422C and 423C to correspond to the corresponding frequency.

The sound/image signal reproduction unit 414 is, for example, a DVD player that uses DVDs as image media. The sound/image signal reproduction unit 414 is configured such that an R-channel sound signal of reproduced sound signals is output to the power amplifier 422 and an L-channel sound signal of the reproduced sound signals is output to the power amplifier 423. The sound/image signal reproduction unit 414 corresponds to a sound source.

Furthermore, as described above, the ultrasonic transducer 424 driven in the R-channel power amplifier 422 includes the high-frequency-band ultrasonic transducer 424A that reproduces signals, which correspond to frequency components in the high frequency band, among sound signals and the low-frequency-band ultrasonic transducer 424B that reproduces signals, which correspond to frequency components in the low frequency band, among the sound signals. Furthermore, the ultrasonic transducer 425 driven in the L-channel power amplifier 423 includes the high-frequency-band ultrasonic transducer 425A that reproduces signals, which correspond to frequency components in the high frequency band, among the sound signals and the low-frequency-band ultrasonic transducer 425B that reproduces signals, which correspond to frequency components in the low frequency band, among the sound signals. That is, sound signals, which belong to high register, among the R-channel and L-channel sound signals are reproduced by the high-frequency-band ultrasonic transducers 424A and 425A, and bass sound signals among the R-channel and L-channel sound signals are reproduced by the low-frequency-band ultrasonic transducers 424B and 425B.

In addition, the sound/image signal reproduction unit 414 may be a reproduction apparatus that reproduces a video signal input from the outside, without being limited to the DVD player. Moreover, the sound/image signal reproduction unit 414 has a function of outputting a control signal instructing the reproduction range setting unit 412 of the reproduction range such that the reproduction range of the reproduced sound can be dynamically changed to obtain the sound effect corresponding to a scene of a reproduced image.

The image creating unit 432 includes a display, such as a liquid crystal monitor or a plasma display panel (PDP), and a driving circuit that drives the corresponding display on the basis of an image signal output from the sound/image signal reproduction unit 414 and serves to create images obtained from image signals output from the sound/image signal reproduction unit 414.

The projection optical system 433 has a function of projecting an image displayed on the display onto a projected surface, such as a screen, provided at the front side of the main projector body 420.

Next, an operation of the projector 401 having the configuration described above will be described. First, data (distance information) indicating the reproduction range of a reproduced signal, which is supplied from the operation input unit 410 by a user's key operation, is set in the reproduction range setting unit 412, such that a reproduction instruction with respect to the sound/image signal reproduction unit 414 is made.

As a result, the distance information specifying the reproduction range is set in the reproduction range setting unit 412, and the reproduction range control processing unit 413 is supplied with the distance information set in the reproduction range setting unit 412. Then, the reproduction range control processing unit 413 obtains a frequency of a carrier wave corresponding to the set distance information by referring to the table stored in the storage unit and controls the carrier wave supply units 422C and 423C so as to generate carrier waves having the corresponding frequency.

Then, the carrier wave supply units 422C and 423C generate carrier waves having the frequency corresponding to the distance information set in the reproduction range setting unit 412 and then outputs the generated carrier waves to the modulated unit (not shown) in the power amplifiers 422 and 423.

On the other hand, the sound/image signal reproduction unit 414 outputs R-channel sound signals of the reproduced sound signals to the power amplifier 422, L-channel sound signals to the power amplifier 423, and image signals to the image creating unit 432 of the main projector body 420.

The image creating unit 432 creates and displays images by driving the display on the basis of input image signals. The image displayed on the display is projected onto a projected surface, for example, the screen 402 shown in FIG. 11 by means of the projection optical system 433.

As described above, in the propagation of an ultrasonic wave radiating toward the medium (air) by the ultrasonic transducers, the sound speed is fast in a portion where the sound pressure is high but slow in a portion where the sound pressure is low as the ultrasonic wave propagates. As a result, the waveform is distorted. In the case when radiating signals (carrier waves) in the ultrasonic frequency band are modulated (AM modulated) with signals in the audible frequency band, the signal waves in the audible frequency band used for modulation are separated from the carrier waves in the ultrasonic frequency band due to a result of the waveform distortion, and thus the signal waves in the audible frequency band are self-demodulated. At this time, the diffusion of the reproduced signal leads to a beam shape due to the characteristic of an ultrasonic wave, and as a result, a sound is reproduced only in the specific direction, which is totally different from a case of a typical speaker.

The beam-shaped reproduced signals, which are output from the ultrasonic transducers 424 and 425 included in the ultrasonic speaker, radiate toward a projected surface (screen), onto which images are projected, by the projection optical system 433 and is then reflected from the projected surface to be diffused. In this case, the distance until the reproduced signal is separated from the carrier wave in the radiation-axis direction (normal-line direction) from the sound wave radiating surfaces of the ultrasonic transducers 424 and 425 and the beam width (diffusion angle of a beam) of the carrier wave vary depending on a frequency of a carrier wave set in the reproduction range setting unit 412. As a result, the reproduction range varies.

Figure 14:
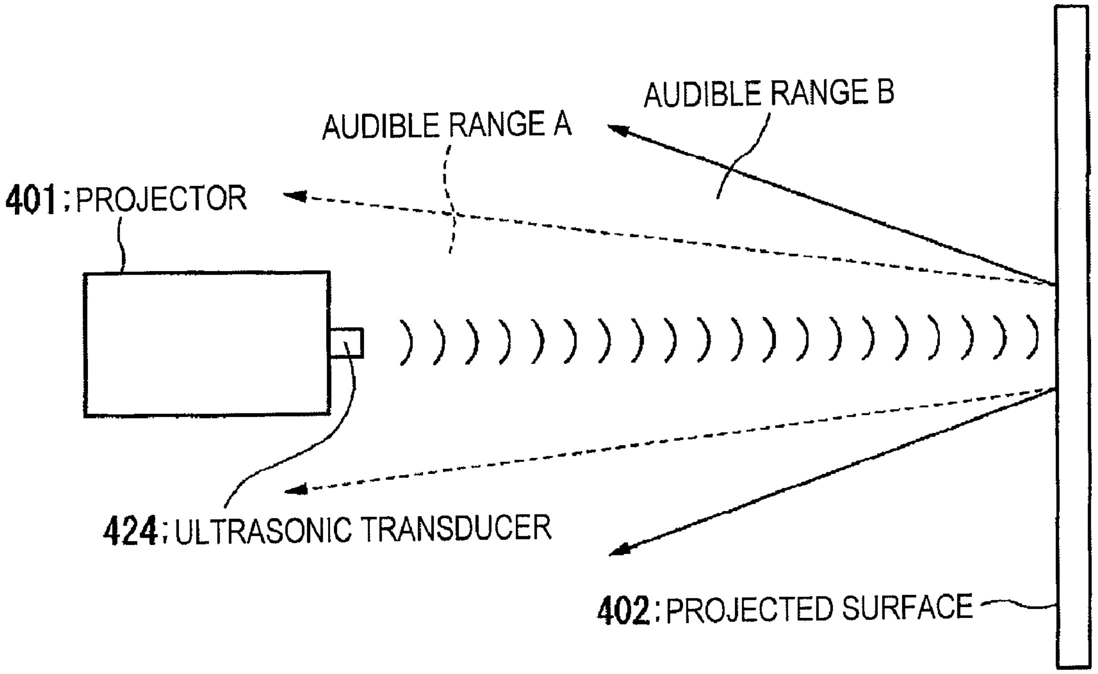
FIG. 14 is a view illustrating a state in which a reproduced signal is reproduced by an ultrasonic transducer.

FIG. 14 illustrates a state when reproduced signals are reproduced by the ultrasonic speaker, which is configured to include the ultrasonic transducers 424 and 425, in the projector 401. In the projector 401, when the ultrasonic transducer 424 is driven by a modulated signal obtained by modulating a carrier wave with a sound signal, if a carrier frequency set by the reproduction range setting unit 412 is low, the distance until the reproduced signal is separated from the carrier wave in the radiation-axis direction (direction of a normal line of sound wave radiating surfaces) from the sound wave radiating surface of the ultrasonic transducer 424, that is, a distance up to a reproduction point increases.

Accordingly, reproduced beams of the reproduced signal in the audible frequency band reach the projected surface (screen) 402 without being dispersed over a relatively wide range. Then, the beams are reflected from the projected surface 402 under the state described above, and accordingly, the reproduction range becomes an audible range 'A' indicated by a dotted arrow in FIG. 14. As a result, the reproduced signal (reproduced sound) can be heard only in a range which is narrow and relatively far from the projected surface 402.

In contrast, in the case when the carrier frequency set by the reproduction range setting unit 412 is higher than the case described above, sound waves radiating from the sound wave radiating surface of the ultrasonic transducer 424 are diffused over a wide range as compared with the case in which the carrier frequency is low; however, the distance until the reproduced signal is separated from the carrier wave in the radiation-axis direction (direction of a normal line of the sound wave radiating surface) from the sound wave radiating surface of the ultrasonic transducer 424, that is, the distance up to the reproduction point decreases.

Accordingly, reproduced beams of the reproduced signal in the audible frequency band reach the projected surface 402 while being dispersed before reaching the projected surface 402. Then, the beams are reflected from the projected surface 402 under the state described above, and accordingly, the reproduction range becomes an audible range 'B' indicated by a solid arrow in FIG. 14. As a result, the reproduced signal (reproduced sound) can be heard only in a range which is wide and relatively close to the projected surface 402.

As described above, in the ultrasonic speaker used in the projector according to the embodiment of the invention, audio signals are divided into two frequency bands of the high frequency band and the low frequency band, carrier waves are modulated with signal waves corresponding to the respective high frequency band and low frequency band, and different ultrasonic transducers provided corresponding to the high frequency band and the low frequency band are driven. Accordingly, it is possible to set modulated waves in respective frequency bands with a large degree of modulation and to make an adjustment such that sounds in the middle and low frequency band are output to the maximum. As a result, an adjustment to proper sound quality and volume with respect to audio signals can be easily made. In addition, the control of the reproduction range can also be easily performed.

Furthermore, the above-described projector is used when a user desires to see images in a large screen; however, since a large-screen liquid crystal television or a large-screen plasma television has recently come into wide use, the ultrasonic speaker according to the embodiment of the invention can be efficiently applied to those large-screen televisions.

That is, it is possible to cause sound signals to radiate locally toward a front side of the large-screen television by using the ultrasonic speaker in the large-screen television.

Having described about the embodiments of the invention, the ultrasonic speaker system and the display device according to the embodiments of the invention are not limited to the examples described above, but various changes and modifications thereof could be made without departing from the spirit or scope of the invention.

The entire disclosure of Japanese Patent Application Nos: 2006-026592, filed Feb. 3, 2006 and 2006-350050, filed Dec. 26, 2006 are expressly incorporated by reference herein.

What is claimed is:

1. A method of controlling an output of an ultrasonic speaker that reproduces audible-frequency-band signal sounds by modulating carrier waves with audible-frequency-band signal waves output from a signal source and driving an ultrasonic transducer with the modulated waves, comprising:

dividing the audible-frequency-band signal waves into a plurality of frequency bands;

separately adjusting amplitudes of the signal waves and amplitudes of the modulated waves in the respective frequency bands; and driving a plurality of ultrasonic transducers provided corresponding to the respective frequency bands with the modulated waves generated corresponding to the respective frequency bands, wherein band-corresponding volume setting data, which is used to set volume of the ultrasonic transducers corresponding to the respective frequency bands by means of a plurality of band-corresponding volume setting units provided corresponding to the respective frequency bands, and overall volume setting data, which is used to set volume in common with respect to the plurality of ultrasonic transducers by means of an overall volume setting unit, are provided, and gains of modulated wave amplitude adjustment units that adjust the amplitudes of the modulated waves in the respective frequency bands are determined corresponding to the respective frequency bands on the basis of a combination of the band-corresponding volume setting data and the overall volume setting data.

2. The method of controlling an output of an ultrasonic speaker according to claim 1, further comprising:

detecting amplitude data of the signal waves in the respective divided frequency bands; and making a control on the basis of the detected amplitude data of the signal waves in the respective frequency bands such that maximum amplitude values of the signal waves in the respective frequency bands are constant by means of signal wave amplitude adjustment units provided corresponding to the respective frequency bands.

3. The method of controlling an output of an ultrasonic speaker according to claim 1, wherein maximum amplitude values of the signal waves in the respective divided frequency bands are amplified to a large degree in signal wave amplitude adjustment units provided corresponding to the respective frequency bands within a range in which the modulated waves in the respective frequency bands are not overmodulated.

4. The method of controlling an output of an ultrasonic speaker according to claim 1, wherein a control is made such that the gains of the modulated wave amplitude adjustment units increase in proportion to increase of set values of the band-corresponding volume setting units.

5. The method of controlling an output of an ultrasonic speaker according to claim 1, wherein a control is made such that the gains of the modulated wave amplitude adjustment units under a condition of set values of the band-corresponding volume setting units increase in proportion to increase of set values of the overall volume setting unit.

6. The method of controlling an output of an ultrasonic speaker according to claim 1, wherein set values of the overall volume setting unit are controlled such that a gain of the modulated wave amplitude adjustment unit corresponding to a lower frequency band of the plurality of divided frequency bands is larger in the case when set values of the band-corresponding volume setting units are equal to each other.

7. An ultrasonic speaker system having a signal source that generates signal waves in an audible frequency band, a carrier wave supply unit that generates carrier waves in an ultrasonic frequency band, and an ultrasonic transducer that modulates the carrier waves with the audible-frequency-band signal waves output from the signal source and is driven by the modulated waves, comprising:

a plurality of filters that divide the audible-frequency-band signal waves into a plurality of frequency bands;

a plurality of signal wave amplitude adjustment units that separately adjust amplitudes of the signal waves in the respective frequency bands;

a plurality of modulation units that modulate the carrier waves with the signal waves in the respective frequency bands;

a plurality of modulated wave amplitude adjustment units that separately adjust amplitudes of the modulated waves output from the plurality of modulation units;

a plurality of ultrasonic transducers driven by output signals of the plurality of modulated wave amplitude adjustment units;

band-corresponding volume setting units that are provided corresponding to the respective frequency bands and separately set volume of the ultrasonic transducers corresponding to the respective frequency bands;

an overall volume setting unit that sets volume in common with respect to all of the ultrasonic transducers corresponding to the respective frequency bands; and modulated wave amplitude gain control units provided corresponding to the respective frequency bands that, in the respective frequency bands, receive band-corresponding volume setting data indicating states of the band-corresponding volume setting units and overall volume setting data indicating a state of the overall volume setting unit and determine gains of the modulated wave amplitude adjustment units provided corresponding to the respective frequency bands on the basis of a combination of the band-corresponding volume setting data and the overall volume setting data when adjusting amplitudes of the modulated waves generated in the respective frequency bands.

8. The ultrasonic speaker system according to claim 7, further comprising:

a plurality of storage units that store a first table indicating the relationship between maximum amplitude data of the signal waves in the respective frequency bands and amplitude gains of the signal wave amplitude adjustment units provided corresponding to the respective frequency bands, wherein, when adjusting amplitudes of the signal waves in the respective frequency bands, the amplitude gains of the signal wave amplitude adjustment units provided corresponding to the respective frequency bands are determined referring to the first table on the basis of the maximum amplitude data provided corresponding to the respective frequency bands.

9. The ultrasonic speaker system according to claim 8, wherein the first table is configured to determine the amplitude gains of the signal wave amplitude adjustment units provided corresponding to the respective frequency bands such that maximum degrees of modulation of the modulated waves in the respective frequency bands are constant when the maximum amplitude data of the signal waves in the respective frequency bands changes.

10. The ultrasonic speaker system according to claim 8, wherein the first table is configured such that maximum amplitude values of the signal waves in the respective divided frequency bands are amplified to a large degree in the signal wave amplitude adjustment units provided corresponding to the respective frequency bands within a range in which the modulated waves in the respective frequency bands are not overmodulated.

11. The ultrasonic speaker system according to claim 7, further comprising:

a plurality of storage units that store a second table indicating the relationship between amplitude gains of the modulated wave amplitude adjustment units provided corresponding to the respective frequency bands and the combination of the band-corresponding volume setting data provided corresponding to the respective frequency bands and volume setting data set in common corresponding to the frequency bands, wherein, when adjusting amplitudes of the modulated waves in the respective frequency bands, the amplitude gains of the modulated wave amplitude adjustment units provided corresponding to the respective frequency bands are determined referring to the second table on the basis of the band-corresponding volume setting data provided corresponding to the respective frequency bands and the volume setting data.

12. The ultrasonic speaker system according to claim 11, wherein the second table is configured such that the amplitude gains of the modulated wave amplitude adjustment units increase in proportion to increase of set values of the band-corresponding volume setting units.

13. The ultrasonic speaker system according to claim 11, wherein the second table is configured such that the amplitude gains of the modulated wave amplitude adjustment units under a condition of set values of the band-corresponding volume setting units increase in proportion to increase of set values of the overall volume setting unit.

14. The ultrasonic speaker system according to claim 11, wherein the second table is configured such that, as for set values of the overall volume setting unit, an amplitude gain of the modulated wave amplitude adjustment unit corresponding to a lower frequency band of the plurality of divided frequency bands is larger in the case when set values of the band-corresponding volume setting units are equal to each other.

15. A display device comprising:

an ultrasonic speaker that reproduces audible-frequency-band signal sounds by modulating ultrasonic-frequency-band carrier wave signals with audible-frequency-band signal waves supplied from a sound source and driving an electrostatic ultrasonic transducer with the modulated signals; and a projection optical system that projects an image onto a projected surface, wherein the ultrasonic speaker includes:

a plurality of filters that divide the audible-frequency-band signal waves into a plurality of frequency bands;

a plurality of signal wave amplitude adjustment units that separately adjust amplitudes of the signal waves in the respective frequency bands;

a plurality of modulation units that modulate the ultrasonic-frequency-band carrier waves with signal waves in respective frequency bands output from the signal wave amplitude adjustment units;

a plurality of modulated wave amplitude adjustment units that separately adjust amplitudes of modulated waves output from the plurality of modulation units; and a plurality of ultrasonic transducers driven by output signals of the plurality of modulated wave amplitude adjustment units, band-corresponding volume setting units that are provided corresponding to the respective frequency bands and separately set volume of the ultrasonic transducers corresponding to the respective frequency bands;

an overall volume setting unit that sets volume in common with respect to all of the ultrasonic transducers corresponding to the respective frequency bands; and modulated wave amplitude gain control units provided corresponding to the respective frequency bands that, in the respective frequency bands, receive band-corresponding volume setting data indicating states of the band-corresponding volume setting units and overall volume setting data indicating a state of the overall volume setting unit and determine gains of the modulated wave amplitude adjustment units provided corresponding to the respective frequency bands on the basis of a combination of the band-corresponding volume setting data and the overall volume setting data when adjusting amplitudes of the modulated waves generated in the respective frequency bands.

* * * * *